United States Patent
Goodwin et al.

(10) Patent No.: US 9,605,948 B2
(45) Date of Patent: Mar. 28, 2017

(54) MINIMIZATION OF ABBE ERROR CAUSED BY TIP OR TILT BETWEEN AN ENCODER HEAD AND A WAFER STAGE FOR ARBITRARY LOCATION OF A CENTER OF ROTATION

(71) Applicant: NIKON CORPORATION, Tokyo (JP)

(72) Inventors: Eric Peter Goodwin, Tucson, AZ (US); Zhiqiang Liu, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 14/736,118

(22) Filed: Jun. 10, 2015

(65) Prior Publication Data

US 2015/0276385 A1 Oct. 1, 2015

Related U.S. Application Data

(63) Continuation-in-part of application No. 13/796,316, filed on Mar. 12, 2013, now Pat. No. 9,243,896.

(60) Provisional application No. 62/010,277, filed on Jun. 10, 2014.

(51) Int. Cl.
| | |
|---|---|
| *G03B 27/68* | (2006.01) |
| *G01B 11/14* | (2006.01) |
| *G01D 5/34* | (2006.01) |
| *G03F 7/20* | (2006.01) |

(52) U.S. Cl.
CPC .............. *G01B 11/14* (2013.01); *G01D 5/34* (2013.01); *G03F 7/70775* (2013.01)

(58) Field of Classification Search
CPC ........................... G03F 7/70775; G01B 11/14
USPC ......................................... 355/52, 53, 55, 67
See application file for complete search history.

(56) References Cited

U.S. PATENT DOCUMENTS

| | | | |
|---|---|---|---|
| 6,677,601 B2* | 1/2004 | Shiraishi ................... | G03F 9/70 250/237 G |
| 8,514,373 B2* | 8/2013 | Shibazaki .............. | G01D 5/266 355/53 |
| 2014/0049762 A1 | 2/2014 | Goodwin | |

* cited by examiner

*Primary Examiner* — Hung Henry Nguyen
(74) *Attorney, Agent, or Firm* — Yakov Sidorin, Esq.; Quarles & Brady, LLP

(57) ABSTRACT

Methodology of measuring a position of a wafer with an encoder directing measurement beam(s) of light towards a wafer area that is being contemporaneously patterned in an exposure apparatus. The Abbe error of such measurement is minimized or even negated by combining the data from first and second measurement signals, one of which is defined as complementary, Abbe-error correcting measurement signal for which the induced Abbe error is either opposite to or at least different from the Abbe error corresponding to another, main measurement signal. The combination of the main and Abbe-error correcting signals is performed with a heterodyne interferometer employing a two-dimensional diffraction grating diffracting each of the measurement beams twice.

10 Claims, 15 Drawing Sheets

MINIMIZATION OF ABBE ERROR CAUSED BY TIP OR TILT BETWEEN AN ENCODER HEAD AND A WAFER STAGE FOR ARBITRARY LOCATION OF A CENTER OF ROTATION

CROSS REFERENCE TO RELATED APPLICATIONS

The present application claims priority from a U.S. Provisional Patent Application No. 62/010,277 filed on Jun. 10, 2014. The disclosure of the above-referenced provisional patent application is incorporated herein by reference in its entirety.

The present application is also a continuation-in-part from the U.S. patent application Ser. No. 13/796,316 filed on Mar. 12, 2013, titled "Two Axis Encoder Head Assembly", and now published as U.S. 2014/0049762. The disclosure of the above-referenced application is incorporated herein by reference in its entirety.

BACKGROUND

Exposure apparatus are commonly used to transfer images from a reticle onto a semiconductor wafer during semiconductor processing. A typical exposure apparatus, used for transfer of a pattern from a reticle onto a substrate of interest (interchangeably—a target substrate or a wafer, such as a semiconductor wafer during the semiconductor processing) includes an illumination source, a reticle stage assembly (that positions a reticle within the apparatus), an optical assembly containing projecting optics, and a wafer stage assembly (that positions the target substrate or a wafer). The exposure apparatus also includes a measurement system (that monitors positions of the reticle and the target substrate), and a control system that governs operations of various assemblies to adjust, when required, mutual positioning of the reticle and the target substrate. The geometrical features of patterns transferred from the reticle onto the target substrate are extremely small, which imposes extremely tight requirements on precise positioning of the target substrate and the reticle to manufacture high quality patterned semiconductor wafers.

Accuracy of the measurement system employed by the exposure apparatus constantly requires improvement (which is partly driven by advances in design of exposure apparatus), while relatively small size, simplicity of construction, a need for reduced number of moving parts and high sensitivity remain as practical limitations.

SUMMARY

The present embodiment is directed toward a measurement system and method for measuring a position of a work piece, such as a wafer-stage carrying a wafer, and employing a encoder head or unit directing light towards the same area of the wafer that is simultaneously being patterned, but from the side of the wafer stage that is opposite to the side carrying the wafer. The two-dimensional diffraction grating disposed on the same side of the wafer-stage as the back-side encoder unit intersects the light from the encoder unit and diffracts it twice. The optical path this light on its way to the diffraction grating and its spectral content is judiciously defined to ensure that a first Abbe error (that is associated with first measurement data acquired with the use of a first portion of light) and a second Abbe error (that is associated with first measurement data acquired contemporaneously with the use of a second portion of light) at least partially compensate each other, thereby reducing or even eliminating the overall Abbe error associated with the measurement.

Embodiments of the invention provide a measurement system for measuring a position of a workpiece. The system includes a two-dimensional (2D) diffraction grating mechanically coupled to the workpiece. The system also includes an encoder unit facing the 2D grating, the encoder unit having first and second encoder heads, said heads configured to produce respectively-corresponding first and second measurement beams incident onto a grating at a respectively corresponding first and second points of incidence and to form first and second first-order diffraction beams at said first and second points of incidence The encoder unit is positioned such that first and second separations are minimized; the first separation defined between i) a first point of intersection of a first vector, bisecting an angle formed by the first measurement beam and the corresponding first first-order diffraction beam and ii) a center-of rotation of the workpiece; the second separation defined between iii) a second point of intersection of a second vector, bisecting an angle formed by the second measurement beam and the corresponding second first-order diffraction beam and iv) the center-of rotation.

Embodiments of the invention provide a method for reducing an Abbe-error during a measurement of a position of a wafer with the use of a back-side encoder unit. Such method includes measuring the wafer position under conditions that result in defining an effective point of the measurement at a first axial location, the separation of which from a second axial location (corresponding to a center of tilt of the wafer) is minimized.

The method may include impinging a main measurement beam generated by the back-side encoder unit on two-dimensional (2D) diffraction grating at a corresponding main location and impinging a complementary measurement beam on said 2D diffraction grating at a corresponding complementary location, the main and complementary locations defined on opposite sides of an axis that is perpendicular to the wafer and that corresponds to the wafer-pattern-forming beam of light. Each of the main and complementary measurement beams contain lights at first and second wavelengths. The geometry of impinging is structured such that a first effective point of measurement defined at the first wavelength and a second point of measurement defined at the second wavelength are axially separated from the center of tilt of the wafer.

Embodiments of the invention additionally provide a method for reducing an Abbe-error during a measurement of a position of a wafer with the use of a back-side encoder unit. The method include measuring said position with the use of first and second light inputs produced by the back-side encoder, where the first and second light inputs are defined such that an overall Abbe error calculated based on first and second Abbe errors is reduced as compared to either a first Abbe error or a second Abbe error. Here, the first Abbe error corresponds to measurement data acquired based on the first light input, and the second Abbe error corresponding to measurement data acquired based on the second light input. In a specific case, values respectively corresponding to the first and second Abbe errors have opposite signs, while the results of the first and second measurements of the desired quantity, such as x-position, have the same signs. The overall Abbe error is assessed as a weighted sum of the first and second Abbe errors.

BRIEF DESCRIPTION OF THE DRAWINGS

The invention will be more fully understood by referring to the following Detailed Description in conjunction with the generally not-to-scale Drawings, of which.

DETAILED DESCRIPTION

Figure 1:
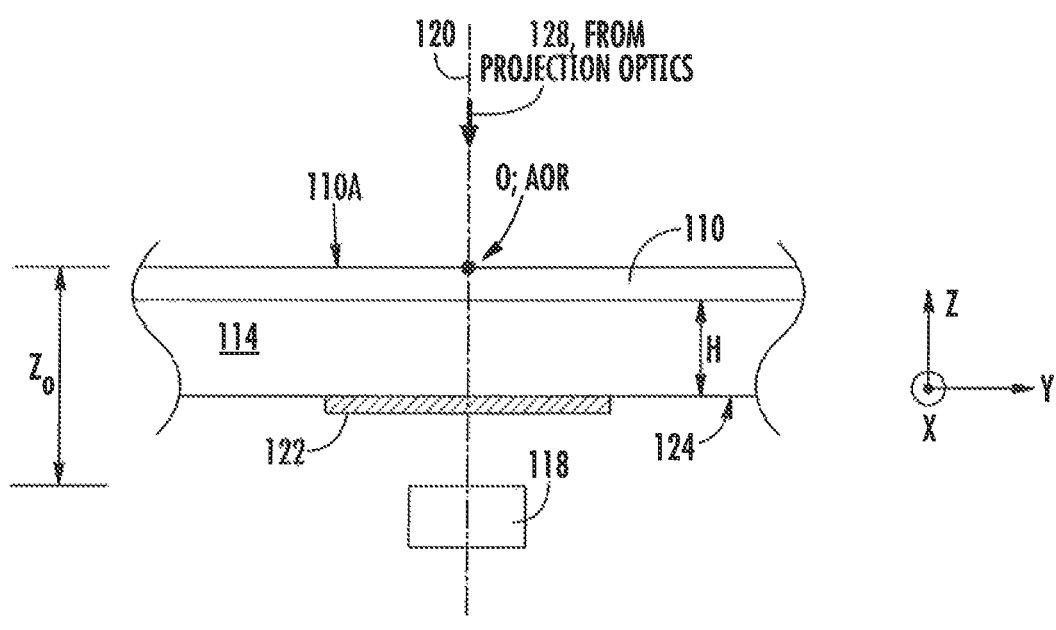
FIG. 1 is a schematic diagram illustrating a portion of the exposure apparatus employing a back-side encoder unit and relative positioning of a wafer and the back-side encoder unit.

While in some configurations an encoder head is positioned above the wafer stage carrying the wafer (considering the mutual orientation of elements and components in a photolithographic system), in an alternative configuration the exposure apparatus the encoder head is placed such as to be on the opposite side of a portion of the wafer stage with respect to the wafer that is under exposure and test. For example, the encoder head may be positioned below (at a back-side of) the portion of the wafer stage such that a sensing unit of the encoder head is substantially under a foot-print of the irradiation beam of light impinging on the wafer from the projection optics. Such orientation provides certain operational advantages not recognized by related art.

During the exposure process, the wafer stage (or wafer stage assembly) with the wafer on it moves across the beam of light to which the wafer is exposed. Conventionally, the tool including the encoder head at the front (upper) side of the wafer is used to perform the post-exposure metrological measurements of a wafer area that has been already exposed and that, at the time of the measurement, differs from the area being patterned (at least for the reason that the encoder head is positioned such as to not block the beam of exposing light incident on the wafer). Accordingly, the area being measured and/or characterized with the encoder head is moved away from and is not under the exposing light beam, as a result of operation of the wafer stage.

In stark contradistinction with that typical situation, the encoder unit that is termed, for the purpose of this disclosure and the appended claims, to be a back-side encoder can be positioned directly under the area that is being exposed at the moment, such that the metrology of the patterned structure formed on the wafer is turned into a measurement that is substantially contemporaneous, simultaneous with the process of exposure/patterning itself. Moreover, as the wafer moves across the beam of exposing light, the position of such "back-side" encoder may remain, in practice, directly facing and unchanged with respect to an area of the wafer that at a given moment is being exposed to the beam. The immediate advantageous result of such positioning of the encoder is derived from the fact the wafer area being patterned at the moment is minimally, if at all, affected by different causes that cumulatively vary a spatial location of another, post-exposure area (measured in the conventional approach, with the front-side encoder). Examples of such causes include temperature-related expansion and/or vibration of the wafer stage. (One can think, for instance, of temperature-caused wafer stage warping or stretching that unpredictably shifts, in time, the position of the area being measured by the encoders with respect to the area being exposed by amounts well exceeding the required precision of the measurement and/or critical dimension of the spatial pattern formed on the wafer). The results of the measurement provided by wafer metrology with the use of a back-side encoder unit or head are substantially free from such errors. On the other hand, as a result of the spatial arrangement dictated by mutual positioning of the back-side encoder and a wafer, the Abbe errors are likely to be present.

The term "Abbe error" is a well-known in the art term generally referring to a positional error (or a linear off-set error) introduced through the amplification of an angular error (due to tilt, for example) with distance. For example, the Abbe error is approximately 0.02 μm of error based on a 20 mm distance and a tilt of 1 μradian; in another example, when one measures a point that is 1 meter away at 45 degrees, an angular error of 1 degree corresponds to a positional error of over 1.745 cm, equivalent to a distance-measurement error of 1.745%.

A schematic, not to scale diagram providing an illustration to the mutual positioning of the wafer 110, a portion 114 of the wafer stage carrying the wafer 110, and the back-side encoder/sensor unit 118 is shown in FIG. 1. The wafer is shown to be oriented parallel to the xy-plane of the local coordinate system. The axis 120 indicates a direction along which the beam of light 128 is delivered to the wafer (in the −z direction as shown) from the not-shown optical assembly that projects the pattern of the reticle (also not shown) onto the wafer 110. The back-side sensor 118 performs the measurement of the wafer 110, for example with the use of a heterodyne interferometer approach discussed in U.S. 2014/0049762, which employs the use of a two-dimensional (2D) diffraction grating 122 attached to the lower (back-side) surface 124 of the wafer-stage portion 114. The back-side sensor 118 performs the measurement of a pattern feature at the upper (front) surface of side 110A of the wafer 110, including the (x, y) location shown in FIG. 1 as O (this point O is within the foot-print of the beam 128 on the surface 110A).

In practice, point O corresponds to a point or area where the wafer 110 is being exposed to pattern-defining light delivered from the projection system and, therefore, is the only place on the wafer the position and orientation of which affects the quality of the resulting pattern. Point O, therefore, is a reasonable approximation for a physical center of tip/tilt/rotation of the wafer 110 in the system, and may be interchangeably referred to herein as "point O" or "CoR" (center of rotation). (It is appreciated, that in practice the center of rotation is not always located at point O. The motion of the wafer experienced at point O depends on the relative position and orientation of the point O as compared to its ideal position and orientation. Sometimes this will require only a translation, other times only a rotation, and other times both a translation and a rotation. The CoR in this case can be at such a point that transfers the exposed region of the wafer to the ideal position and orientation of point O. The following disclosure and derivation are presented for the approximated case of CoR=O.)

The tip/tilt/rotation of the wafer about the CoR results in some angular deviation between a line normal to the wafer's surface 110A and the line of sight of the sensor 118 (the latter preferably coinciding with the axis 120). At the same time, the back-side encoder 118 is separated from the location of CoR by the distance $Z_0$ that is at least in part defined by the thickness H of the wafer-stage portion 114. In a specific example, where H=90 mm, such axial displacement between the wafer and the back-side encoder sensor means that, when the wafer 110 is tilted (for example, with respect for the xy-plane and about the axis-of-rotation AOR that is parallel to the y-axis and passes through the point O) by 0.01 degree, the Abbe error of the measurement is caused to be about 15 microns. This Abbe error may be erroneously interpreted by the measurement system as a displacement or shift of the wafer along the y-axis. Therefore, in the situation when the spatial position of the wafer or an identified wafer feature is being monitored, the wafer tilt contributes—unless corrected—to the error in the determination of such spatial position.

Since, in practice, the separation between a point measured and/or monitored by the sensor 118 and the point O (or axis AOR) of the rotation is non-zero (due to the presence of at least the wafer stage 114 between the two), correction at a data-processing stage of the measurement process could be employed to compensate for such error. However, the data-processing correction (performed, typically, using software implemented data-processing algorithms), is very complex. Indeed, to eliminate this error in an exposure apparatus operating at about 193 nm, when the target tolerance in measurement of linear displacement is about 0.2 nm, the error has to be corrected by a factor of about 75,000. Alternatively or in addition, not to exceed the target linear measurement error, the tilt angle of the wafer 110 has to be known to a value better than (0.01 degree/75,000) ~1.3e-7 of a degree. In practice, such practical error margin is at least several tens of times larger than it would be in another angular measurement. This overwhelmingly strict requirement is caused by the fact that any error in the measurement of the angle of tilt of the wafer, the result of which is used to make a software-based correction, is magnified during the process of correction.

The present invention provides a way of performing the wafer metrology with the use of an exposure apparatus employing a back-side encoder such that the Abbe error (resulting from the hardware-defined non-zero separation between the encoder sensor and the measurement point at the wafer) is minimized and/or corrected as a result of the modification of the data-acquisition methodology. According to the idea of the invention, the data acquisition process is modified by adding a second, Abbe-error-correcting measurement of the wafer (optionally performed contemporaneously with the initial, first measurement) such that the effective Abbe error based on the first and second measurements combined is minimized The data acquired with these two signals are either averaged or "weighted" with one another. In the case of averaging, for example, the error increases only by sqrt(2) as a results of adding together two independent errors. Accordingly, the requirement to the individual errors carried in the measurements with standard and the Abbe-error-correcting signals are much looser than those applied when the software-based correction methodology is used. One could afford to have these errors only sqrt(2)-times smaller than before, which is much better than 20-200× as required in a pure software correction. Weighting the two signals 25% to 75%, for example, still keeps the required accuracy at least an order of magnitude easier than in the pure software-based error correction.

A problem of the presence of Abbe error, caused by the physical non-zero separation between the back-side encoder and the wafer being measured in the lithographic system (such wafer disposed on that side of the wafer stage that is opposite to the side facing the encoder) is solved by performing the wafer measurement under conditions that result in defining an effective point of measurement at a location that is as close to the location of the physical center of rotation, CoR, of the wafer as possible (and which, in a specific case, coincides with the physical CoR), thereby minimizing and/or eliminating the axial separation between the effective measurement point and the CoR and, accordingly, minimizing and/or eliminating the Abbe error.

A problem of the presence of Abbe error, caused by the physical non-zero separation between the back-side encoder and the wafer (that is being measured in the lithographic system employing such back-side encoder) is solved by adding a complementary, Abbe-error correcting measurement signal for which the induced Abbe error is either opposite in sign to or at least different from the Abbe error corresponding to the initial, first measurement signal such that the overall Abbe error is negated/removed by combining the first and second signals instead of performing very complex, high precision, and operationally involved (albeit possibly sufficiently accurate) measurements of the wafer tilt followed by correcting the Abbe error in software.

Example of an Exposure Apparatus Employing Heterodyne Interferometry System for Wafer Measurements with the Back-Side Encoder Head.

Figure 2:
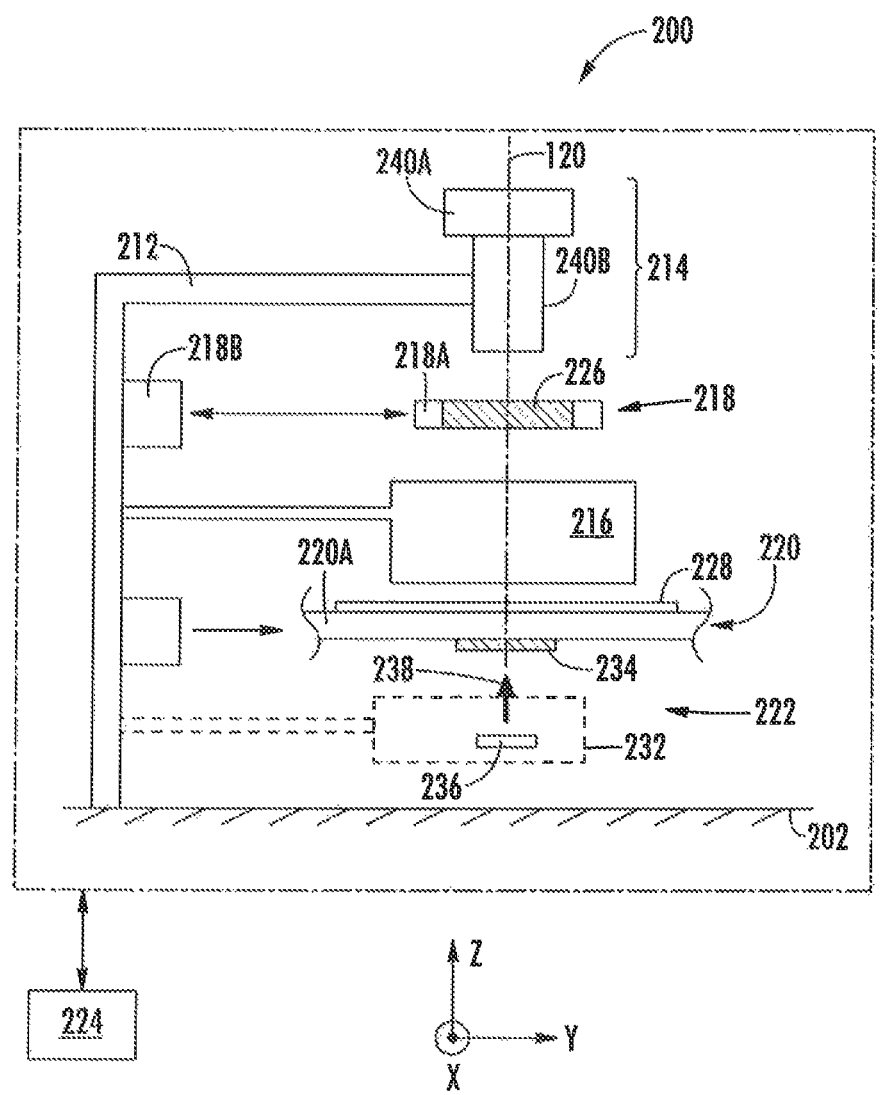
FIG. 2 is a schematic illustration of an exposure apparatus including a measurement system having features of an embodiment of the invention.

One example of an exposure apparatus employing heterodyne interferometry for measurements of wafer displacements and an encoder head(s) positioned above the wafer being measured was discussed in U.S. 2014/0049762, the disclosure of which is incorporated herein by reference. FIG. 2 schematically illustrates, in reference to the provided Cartesian system of coordinates, an example of a similar exposure apparatus 200, in which the encoder head is positioned at the back-side of the wafer (in correspondence with the arrangement schematically illustrated in FIG. 1).

The exposure apparatus 200 includes an apparatus frame 212, an illumination system 214 (also referred to as irradiation apparatus), an optical assembly 216, a reticle stage assembly 218, a wafer stage assembly 220, a measurement system 222, and a control system 224. The design of the components of the exposure apparatus 200 can be varied to suit specific requirements. The exposure apparatus 200 may be mounted to/on a mounting base 202, such as the ground, a base, or floor, or some other supporting structure.

Apparatus Frame.

The apparatus frame 212 is rigid and supports and/or houses at least the reticle stage assembly 218, the optical assembly 216, the wafer stage assembly 220, and the illumination system 214 above the mounting base 202.

Illumination System.

The illumination system 214 includes an illumination source 240A and an illumination optical assembly 240B. The illumination source 240A emits radiation to which the wafer/work-piece 228 is exposed and which is guided by the illumination optics of the assembly 240B to the optical assembly 216. On its way to the optical assembly 216, the beam of radiation illuminates a portion of the reticle 226 to gain spatial pattern of irradiation representing the pattern of the reticle 226.

The illumination source 240A can be, for example, any of a g-line source (436 nm), an i-line source (365 nm), a KrF excimer laser (248 nm), an ArF excimer laser (193 nm), a F2 laser (157 nm), or an EUV source (13.5 nm). The wafer-illuminating (exposure) light may be provided at about 193 nm (by an ArF excimer laser system, for example) light (with a wavelength of 193 nm), but it can also include ultraviolet light such as described in, for example, U.S. Pat. No. 7,023,610. The source 240A of illuminating light may exploit harmonic frequency conversion or utilize an optical-fiber based amplifier, to produce radiation at a predetermined wavelength. Alternatively, the illumination source 240A can generate charged particle beams such as an x-ray or an electron beam. For instance, in the case where an electron beam is used, thermionic emission type lanthanum hexaboride (LaB6) or tantalum (Ta) can be used as a cathode for an electron gun. Furthermore, in the case where an electron beam is used, the structure could be such that either a mask is used or a pattern can be directly formed on a substrate without the use of a mask.

Optical Assembly.

The optical assembly 216 projects and/or focuses the light passing through the reticle 226 onto the work piece (wafer) 228. Depending upon the design of the exposure apparatus 200, the optical assembly 216 can scale (i.e., to magnify or reduce, with a specific coefficient) dimensions of the pattern of the reticle 226. In a specific implementation, the optical assembly 226 may simply relay the pattern of the reticle 226 onto the wafer (i.e., have a unit magnification).

Reticle Stage Assembly.

The reticle stage assembly 218 holds and positions, (with the use of a reticle stage mover 218B) the reticle 226 relative to the optical assembly 216 and the wafer 228. The reticle stage mover assembly 218B can be designed to move the reticle 26 along any of the x, y, z axes.

Wafer Stage Assembly.

The wafer stage assembly 220 holds and positions (with the use of a wafer stage mover 220B) the wafer 228 with respect to the image of the illuminated portion of the reticle 226 projected onto the wafer. The wafer stage mover 220B can be designed to move the wafer 228 along any of the x, y, z axis. In one embodiment, the wafer 228 can be scanned while the wafer stage assembly 220 moves the wafer 228 along the y-axis.

Measurement System.

The measurement system 222 includes an encoder assembly 232 that measures, in operation, the position of a work piece (as shown—the wafer 228). For example, in some embodiments, the encoder assembly 232 can be designed to monitor and/or measure the position of the work piece 228 along two axes (e.g., along the x- and y-axes). Additionally and/or alternatively, in one embodiment, the encoder assembly 32 can be designed to measure and/or monitor the position of the work piece 228 along all three axes (i.e., to specify the 3D position of the work piece 228).

The measurement system 222 also includes a stage grating 234 that is secured to a back (bottom) side of the wafer stage 220A (of the assembly 220) that retains the work piece 228, and one or more fixed encoder heads 236.

The number of encoder heads 236 and their mutual positioning and orientation can be varied according to the design of the exposure apparatus 200 and/or the measurement system 222, and the amount of travel of the stage 20A along x- and y-axes. The use of multiple encoder heads 236 enables the encoder assembly 232 to more accurately measure the position of the stage 20A and/or the stage grating 234, and thus the position of the work piece 228 that is retained by the stage 220A.

As discussed in detail in examples disclosed in U.S. 2014/0049762, an encoder head 236 directs, in operation, at least one measurement beam 238 towards the stage 220A and the stage grating 234. The movement and/or positioning of the stage 220A and/or the stage grating 234 is detected based on the measurement(s) of phase of the optical signal(s) initiated by one or more measurement beams 238 resulting signals from the measurement beams 238 that are diffracted twice by the grating 234 upon the beam propagation from the encoder head 236 towards the optical detector of the system (not shown). In a specific case, the movement of the stage 220A and/or the stage grating 234 is defined by determining changes in the phase(s) of the resulting signal(s) caused by spatial angles at which the beam(s) 238 hit the stage grating 234 and not by changes in the optical path length.

In one embodiment, encoder head(s) 236 are generally positioned below the stage grating 234 and below a portion of the wafer stage 220A and under the wafer 228, and at least one encoder head 236 is positioned on the axis 250, along which an area of the wafer 228 is being exposed to illuminating light (delivered along the axis 120) through the optical system 216. As a result, the measurement beam(s) 238 is forwarded in a generally upward fashion toward the stage grating 234 and the stage 220A. Generally, the measurement system 222 can utilize multiple laser interferometers, encoders, autofocus systems, and/or other measuring devices in addition to the encoder assembly 232.

Control System.

The control system 224 is operably connected to and governs the operation of the illumination system 214, the reticle stage assembly 218, the wafer stage assembly 220, and the measurement system 22. The control system 224 acquires measurement data, from the measurement system 222, that represent position and/or orientation and/or movement of the reticle 226 and/or wafer 228 with respect to the optical assembly 216 or another chosen reference. Based on these data, the control system 224 controls the stage assemblies 218, 220 to precisely position the reticle 226 and the wafer 228. The control system 24 can include one or more processors and electronic circuits, at least one of which may be specifically programmed to perform steps of data acquisition, data processing, and control of operation of the components of the apparatus 200.

Generally, the exposure apparatus 200 can be used as a scanning type photolithography system for optical transfer of a spatial pattern from the reticle 226 onto the wafer 228, with the reticle 226 and the wafer 228 moving synchronously. Alternatively, the exposure apparatus 220 can be used as a step-and-repeat type photolithography system that exposes the reticle 226 while the reticle 226 and the wafer 228 are stationary. The use of the exposure apparatus 200, however, is not limited to a photolithography system for semiconductor manufacturing and can include, as a non-limiting example, the use as an LCD photolithography system that projects a liquid crystal display device pattern onto a rectangular glass plate or a photolithography system for manufacturing of a thin film magnetic head.

U.S. 2014/0049762 provides details of embodiments of the heterodyne-interferometer-based principle of operation of the measurement system of the exposure apparatus. For this reason, these details are not discussed here in any particular detail. The measurement system described therein includes, in addition to the encoder head and the 2D stage diffraction grating, auxiliary components among which there are a source of measurement beam(s), beam redirectors (in a specific case—corner cubes), beam adjusters (in a specific case—secondary diffraction gratings), polarizing beam splitters and polarizing plates (such as half-wave plate and quarter-wave plates).

Similarly to and by analogy with the measurement system of the exposure apparatus discussed in U.S. 2014/0049762, both the structure of the an encoder assembly 232 and method of acquisition of data characterizing the positioning of the wafer 228 in embodiments of the present invention are structured and configured to pass the measurement beam(s) 238 (that has propagated from the encoder head(s) 236 to the 2D diffraction grating 234) to be diffracted twice by this grating 234 prior to being collected by the optical detector of the measurement system 222. The structure of the encoder assembly 232 is substantially identical to that discussed in U.S. 2014/0049762, and a portion of it is shown in a schematic diagrams of FIGS. 3A and 3B (that correspond, respectively, to FIGS. 3C and 3D of U.S. 2014/0049762). The measurement beam 238 (shown with two lines) is propagated to the stage diffraction 2D grating 234 (a portion of which 235 is shown for clarity), and the +1 and −1 diffraction orders formed in yz-plane are directed towards the secondary diffraction gratings (beam adjusters) 310. Gratings 310 diffract the beams incident thereon towards the corner cubes (redirectors) 320. In a perspective schematic of FIG. 3B the four corner cubes 320X1, 320X2, 320Y1, 320Y2 are shown. As detailed in U.S. 2014/0049762, these corner cubes transversely displace the beams incident thereon and redirect them back, towards the stage grating 234 where these beams experience diffraction for the second time and forming respective (+1,+1) and (−1,−1) diffraction order beams. It would be appreciated by a person of skill in the art, that the angles of diffraction corresponding to +1 order beam and (+1,+1) order beam—i.e., the angles $A_1$ and $A_2$ corresponding to the $1^{st}$ and $2^{nd}$ occurrence of diffraction of light from the beam 238 at the stage grating 234—are equal: $A_1=A_2=A \sim \arcsin(m\lambda/T)$, where m is the order of diffraction,+1 or −1, of light with a wavelength of λ normally incident on a diffraction grating with a pitch T. Accordingly, the optical scheme of FIGS. 3A, 3B effectively removes the sensitivity of the measurement system 222 to tip/tilt of the stage 220A and/or grating 234 about the x-axis (as shown). More specifically, the final angle of the twice-diffracted beam (defined with respect to the initial direction of propagation of the beam) is not influenced by any tip/tilt of the 2D grating, as the $2^{nd}$ pass beam corrects any error induced by the $1^{st}$ pass because of the presence of the corner cube retroreflector in the optical path.

Figure 3A:
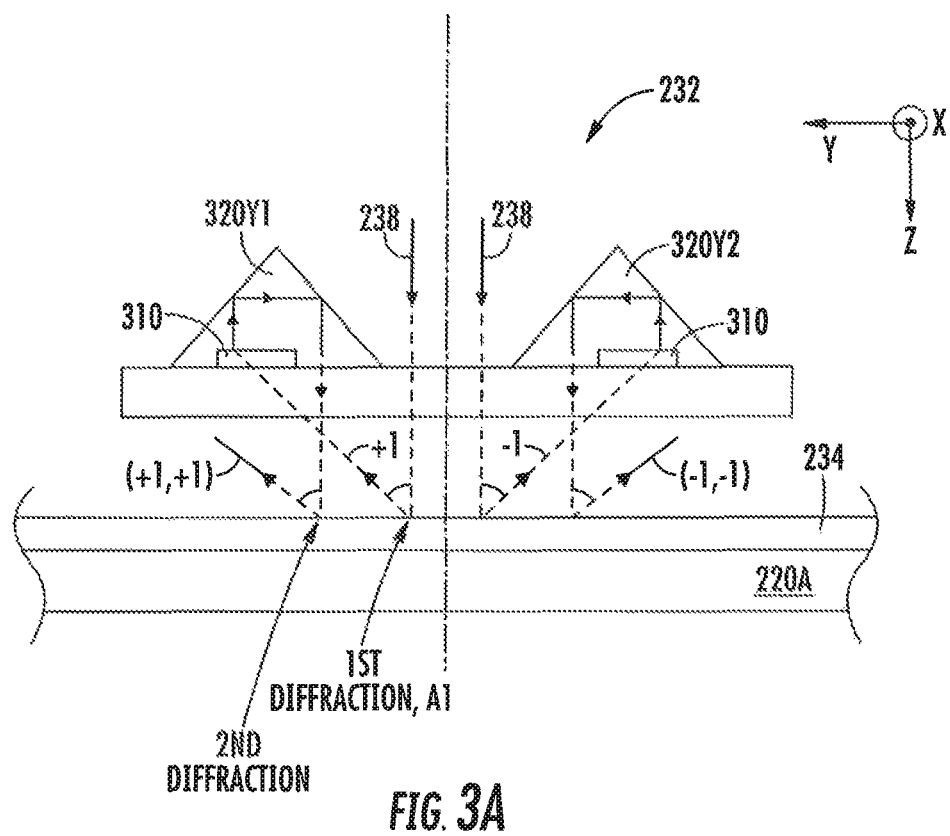
FIG. 3A is a simplified schematic diagram illustrating a back-side encoder assembly (including an encoder unit and a wafer-stage grating) and propagation of measurement beams.
Figure 3B:
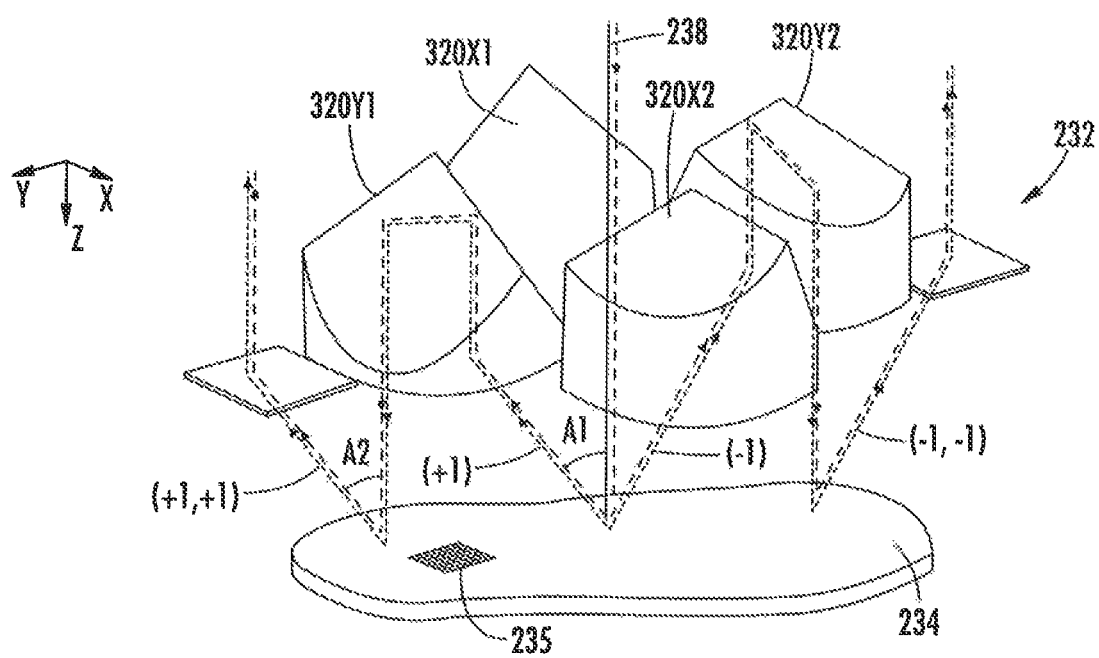
FIG. 3B is a simplified perspective view of a portion of the encoder assembly of FIG. 3A.

FIG. 3A provides only the side view along the x-axis. Both in FIG. 3A and FIG. 3B, only the beams corresponding to diffractive orders propagating in the yz-plane and passing through the corner cubes 320Y1, 320Y2 are shown, for simplicity of illustration. Additional details of optical schematics of the present system can be easily understood by referring to the system discussed in U.S. 2014/0049762, the entire contents of which are incorporated herein by reference.

Examples of Embodiments of a Measurement System and Method Structured to Vary a Position of the Effective Center of Rotation of the Wafer Under Test to Reduce or Eliminate Abbe Error.

It would be appreciated by a person of skill in the art that, when a single measurement beam is used with the back-side encoder head, there is no geometric error (in the determination of wafer positioning) caused by the Abbe error if the tilt-tip/rotation of the wafer stage is about the point where the measurement beam hits the wafer-stage grating. (The tilt/tip/rotation of the wafer stage would include the tilt/tip/rotation of the wafer as well as the wafer-stage 2D diffraction grating, which are attached to opposing surfaces of the wafer stage, as schematically shown in FIG. 1) The Abbe error will be present, however, if the center of rotation is either at a different point in the plane of the grating or in another plane that is different from the plane of the grating (compare, for example, with FIG. 1). Such Abbe error will increase linearly with the separation distance D between the CoR and the point where the measurement beam hits the wafer-stage grating. Schematic diagrams of FIGS. 6A, 6B, 6C, and 6D illustrate this, both for the case when the portion of the measurement beam is returned, in reflection, along the initial direction of incidence (FIGS. 6A, 6C) and at some angle with respect to such direction (for example, in the case of being diffracted in reflection, FIGS. 6B, 6D). Similarly, it can be shown that the Abbe error and the corresponding geometric error in transverse (to the axis 120) positioning of the wafer vary linearly with the axial (along z-axis) separation distance between the point of incidence of the measurement beam and the CoR (not shown in the Figure).

Figure 7A:
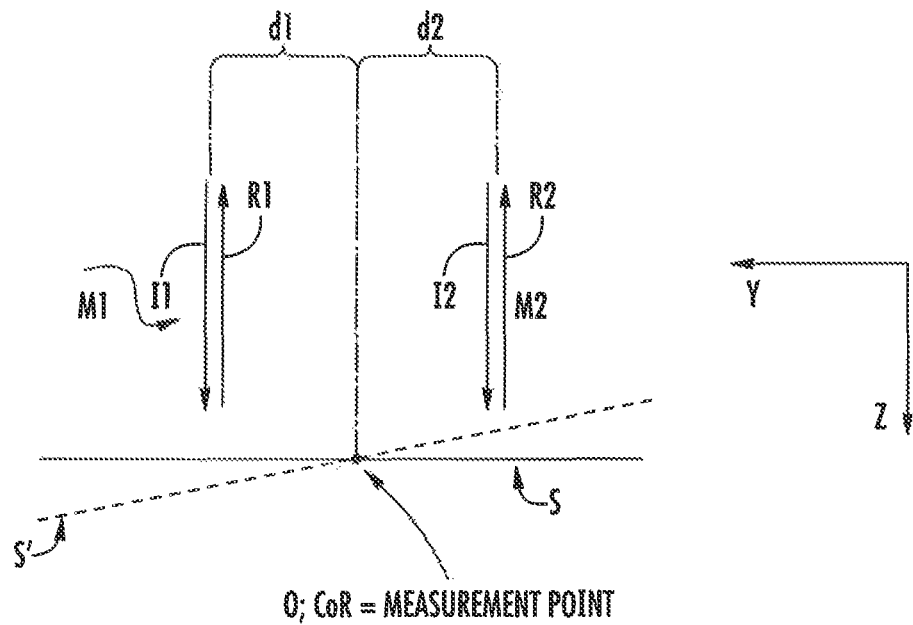
FIGS. 7A, 7B are additional schematic diagrams illustrating presence or absence of Abbe errors during measurement of a wafer for differently structured measurement modalities.
Figure 7B:
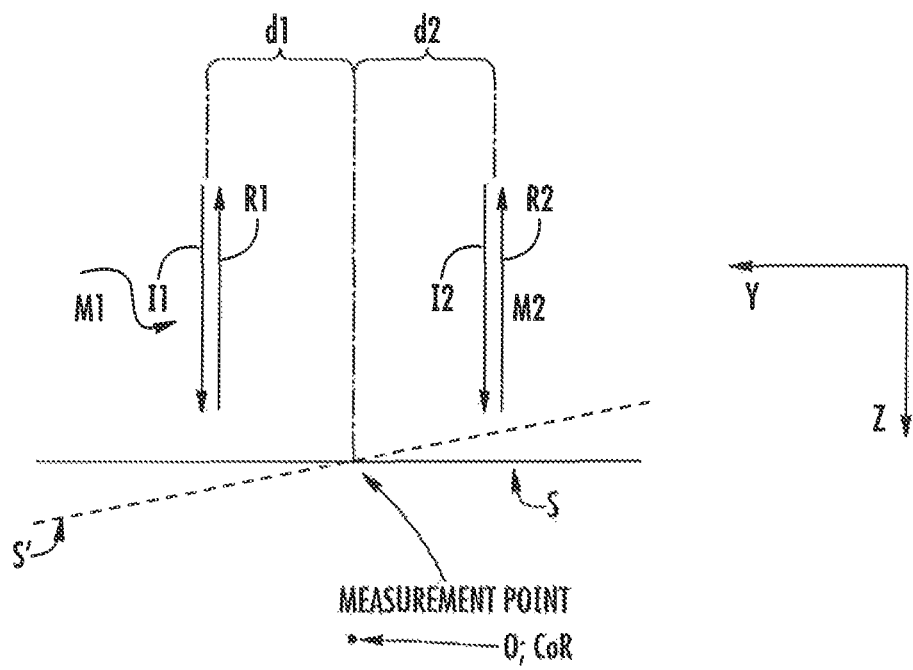

According to an idea of the invention, embodiments of the invention take operational advantage of extending the above concept to a back-side encoder set-up employing more than one measurement beam. To this end, and in reference to FIGS. 7A, 7B, it is noted that:

when two measurement beams M1, M2 having the same optical characteristics are directed to impinge on the wafer-stage grating at points shifted transversely with respect to the measurement point that coincides with the CoR (in FIG. 7A: by d1 and d2, respectively), there is no Abbe-caused error for the measurement with respect to the CoR in the case when such transverse shifts are symmetric (d1=d2), because the effective, spatially averaged over the two beams M1, M2 measurement point coincides with the CoR. The situation when d1≠d2 is considered below;

as illustrated in FIG. 7B (where d1 and d2 denoted transverse shifts and the CoR is axially separated from the measurement point), when two measurement beams M1, M2 having the same optical characteristics are directed to impinge on the wafer-stage grating at points shifted transversely with respect to the measurement point that is different from the CoR, the Abbe-caused error will be present in the measurement results whether d1=d2 or d1≠d2.

Embodiments Employing First and Second Measurement Beams Transversely Off-Set with Respect to the Axis.

Figure 4:
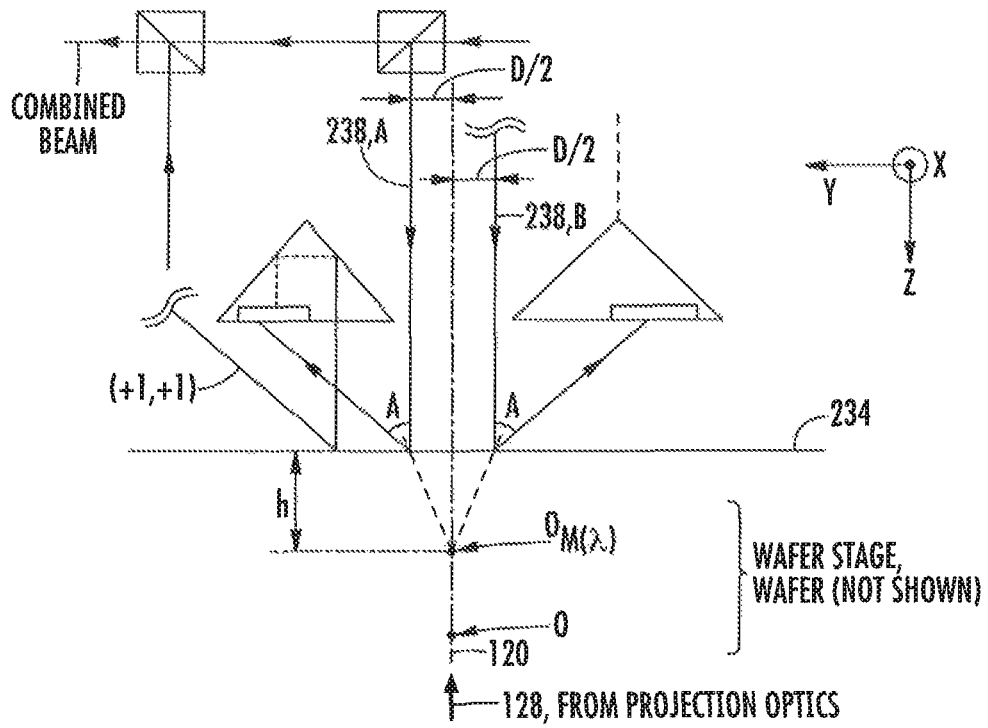
FIG. 4 is a simplified schematic diagram illustrating a portion of heterodyne interferometric system employing the encoder assembly according to an embodiment of the invention.

FIG. 4 represents, in a simplified fashion, an embodiment structured to reduce the Abbe error of the measurement of the wafer (with the system of the invention including the back-side encoder head) by employing first and second measurement beams produced by the back-side encoder unit.

In a specific case, the first measurement may employ the +1 diffraction order of a beam 238A that is directed from the back-side encoder unit 118 to the grating 234 with a transverse (along the y-axis) offset with respect to the axis 120. At the same time, the second measurement may employ the −1 diffraction order of a beam 238B that is (co-linearly with the beam 238A) directed towards the grating 234 with another (as shown—equal, D/2, but symmetrically defined) offset with respect to the axis 120. One way to measure such offsets in practice involves determining the separation between the axis 120 and points at the grating 234 at which the incident beams 238A, 238B impinge. It is appreciated that such transverse offsets cannot, in practice, exceed the distance at which the corner cubes, which redirect the diffracted (+1) and (−1) beams towards the grating for the second occurrence of diffraction, can be displaced from the optical axis of the encoder head due to any physical constraints in the overall system. This physical constraint is defined by the transverse extent of the back-side encoder head. For example, the overall separation D=D/2+D/2 between the two sensors (indicted by the corner cubes in FIG. 4) of about 44 mm is practically achievable when a 50 mm-sized back-side encoder head is employed.

Generally, according to the idea of the invention, the "measurement point" is defined by an intersection of a first line and a second line. The first line is inclined with respect to the normal (to the surface of the diffraction grating disposed on the wafer stage) at an angle that is an average of the angle of incident of the first measurement beam onto the grating from the encoder head and an angle of diffraction of the 1$^{st}$ order diffraction beam. The so-defined angle of inclination of the first line is approximately constant with the angle of incidence of the measurement beam onto the diffraction grating, as a person of skill in the art will readily appreciate (to the degree that the sine of the angle can be approximated by the value of the angle itself). For the sake of practical illustration, if the range of the angle of incidence for the measurement beam from the encoder head onto the diffraction grating of the wafer stage (conventionally defined with respect to the normal) is between 0 and 40 degrees, and the grating period if 1 um, than for light at 632 nm such "average" of the angles of incidence and the diffraction angle for the 1st order of diffraction ranges from 18.44 degrees to 19.6 degrees. (Such angle may be further referred to as the minimum Abbe-error angle). The second line may represent a line defined, in the identical fashion, for a second measurement beam; in some cases the second line is defined by an axis of the pattern-forming beam incident onto the wafer on the opposite side of the wafer-stage from the projection optics. Such examples are discussed below.

It is appreciated by a person of skill in the art that the measurement point in the above-mentioned arrangement of FIG. 4 is point $O_M$. As long as the tilt/tip of the (wafer-stage 220A/grating 234/wafer 110) occurs at about the point $O_M$ (i.e., as long as the measurement point and the physical center of rotation coincide) there is no geometric error in determination of the wafer position caused by the Abbe error (compare with FIG. 7A). Since the metrology system employing the back-side encoder system is structured to observe and monitor the surface of the wafer that is exposed to the wafer-pattern-defining beam of the system (and, in particular, the physical center of rotation—point O—on that wafer surface), the axial position of point $O_M$ may not, generally, coincide with the CoR.

Since the physical location of the center of rotation is denoted as O, the requirement for the nullification of the Abbe error (the situation when the condition D=2h·tan(α) is satisfied) implies that points $O_M$ and O coincide. It is when the measurement point $O_M$ and the physical center of rotation CoR (or O) coincide, the Abbe-caused error of the measurement is nullified. As mentioned above, the angle α is defined as the average of the incident and diffracted beam that is used for the measurement (typically the beam corresponding to the +1 or −1 diffraction order). The value of α is approximately independent of the angle of incidence of the measurement beam onto the grating from the encoder head (beam 238,A in FIG. 4, for example), but in practice varies somewhat based on the diffraction equation $$\sin(\theta_i) + \sin\theta_d = \frac{m\lambda}{T} \cdot \alpha = (\theta_i + \theta_d)/2$$

maybe referred to as the minimum Abbe error angle. Further, h denotes the axial distance between the point of intersection $O_M$ and the surface of the diffraction grating 234. For the symmetric transverse offsets D/2=22 mm and the measurement wavelength of 632.8 nm for both beams 238,A and 238,B, the value of h is about 62.1 mm. In practice, there may remain limitations on how large the value of D can be and, therefore, while the Abbe error may be reduced with the use of two measurement beams 238A, 238B, under some geometrical constraints on the dimensions of the encoder head, it may nevertheless remain non-zero. This corresponds to the situation when the thickness of the wafer-stage (shown as H in FIG. 1) exceeds the value of h. Even when the condition D=2h·tan(α) can be practically satisfied, the deviation of the grating 234 from being flat may still lead to different axial positions at which the beams 238A, 238B impinge on the grating, thereby resulting in position errors if the grating is not perfectly flat. These errors are cancelled if both +1 and −1 order diffracted beams are incident on substantially the same place on the grating, because these beams have (i) equal sensitivity to a change of height of the grating (flatness) and (ii) sensitivities having opposite signs to motion of the grating in y (or x) directions. In practice, the errors stemming from grating non-flatness can be empirically mapped and corrected.

Furthermore, this embodiment is limited with respect to performing multiple measurements along the y-direction (or along the x-direction). Indeed, since the system of the invention is structured to use two corner-cube reflectors separated from one another along the y-direction (as well as two corner cube reflector separated from one another in x-direction) for each measurement, there is a physical limit to how many such corner cubes can be fit into a given extent of the backside encoder head.

Embodiment Employing Measurement Beams at Multiple Wavelengths.

Figure 5:
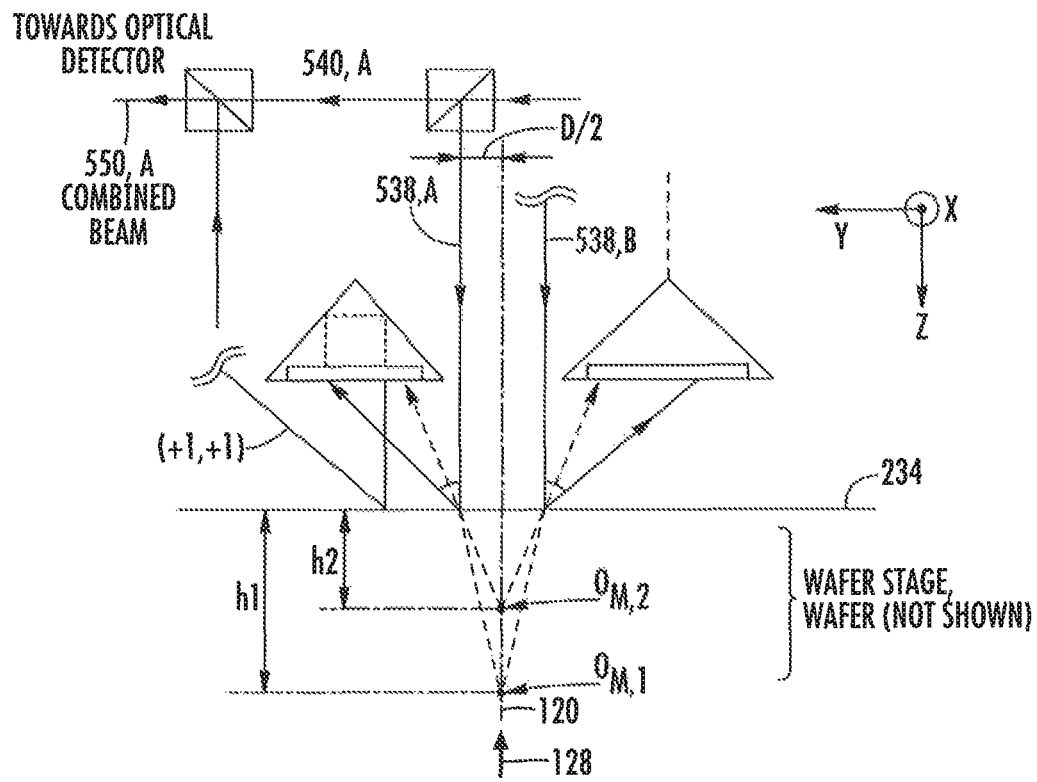
FIG. 5 is a simplified schematic illustration of a portion of the heterodyne interferometric system of FIG. 4 and a pair of measurement beams each of which contains light at first and second wavelengths.
Figure 6A:
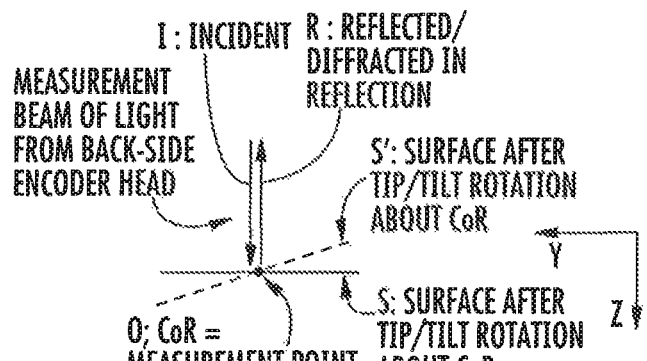
FIGS. 6A, 6B, 6C, and 6D are schematic diagrams illustrating presence or absence of Abbe errors during measurement of a wafer for differently structured measurement modalities.
Figure 6B:
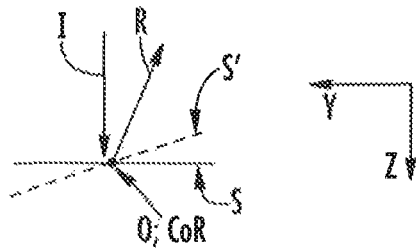
Figure 6C:
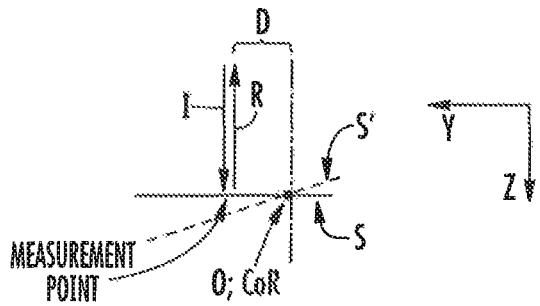
Figure 6D:
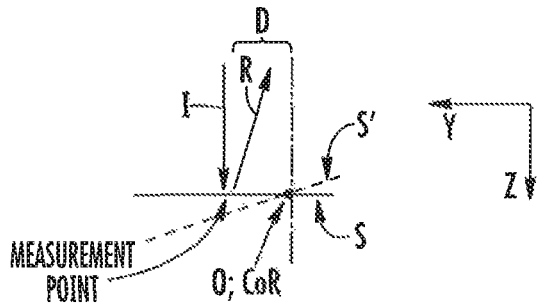

The related improved embodiment structured to measure the position of the wafer stage with reduced Abbe error is based on the realization that the location of the effective measurement point $O_M$, defined by the employed multiple measurement beams (see, for example, FIG. 4), is wavelength-dependent. Indeed, as the minimum Abbe error angle $$\alpha = \frac{1}{2}\left[\theta_i + \arcsin\left(\frac{m\lambda}{T} - \sin\theta_i\right)\right]$$

is wavelength dependent, for a fixed $|m|>0$ the position of the point of intersection of the +1 and −1 diffraction orders of the two measurement beams 238A, 238B of FIG. 4 along the axis 120 will vary as a function of the wavelength. In particular, when the measurement wavelength is changed from, for example, $\lambda_1=632.8$ nm to $\lambda_2\neq\lambda_1$, the axial position $h_2$ of the corresponding effective measurement point $O_{M,2}=O_M(\lambda_2)$ will be defined at a distance $h_2\neq h_1$ from the surface of the grating 234, as shown in FIG. 5. FIG. 5 shows only a specific example of mutual positioning of the points $O_{M,2}=O_M(\lambda_2)$ and the physical center of rotation O. In practice such mutual positioning generally depends on the particular wavelength and the geometry of the wafer stage. In a specific case of $\lambda_2=420$ nm $h_2$ can be determined to be about 106 mm and, therefore, for H=90 mm the point $O_M(\lambda_2)$ will be located on the other side of the CoR with respect to the point $O_{M,1}=O_M(\lambda_1)$.

The embodiment 500 schematically illustrated in FIG. 5 is structured to perform the measurement of the area of the wafer being patterned with the use of the back-side encoder head employing two measurement beams 538A, 538B, each beam containing light at first and second wavelengths $\lambda_1\neq\lambda_2$. (It is understood that, in general, each of the two measurement beams can include light at more than two wavelengths.) In practice, axial positions of the first and second measurement points $O_{M,1}$ and $O_{M,2}$ (respectively corresponding to the first and second measurements at the first and second wavelengths) are determined, after which the axial position of the effective measurement point $O_{M,eff}$ is calculated by finding either a geometric average or a weighted average of the axial positions of $O_{M,1}$ and $O_{M,2}$. Choosing the wavelengths and/or weighting coefficients in such a fashion as to move the effective measurement point $O_{M,eff}$ as close as possible to the physical CoR (point O) results in the minimization (and/or nullification) of the Abbe error and the associated with it geometrical error in transverse positioning of the wafer. This situation is diagrammatically illustrated in FIG. 8, where each of the two measurement beams MB1 and MB2 carries light at two wavelengths, $\lambda_1\neq\lambda_2$.

Accordingly, the value of the aggregate Abbe error in terms of phase ($\tilde{\phi}_{Abbe}$) can be determined either as a geometric average or as a weighted average of the Abbe errors $\phi_1(\lambda_1)$ and $\phi_2(\lambda_1)$ that correspond to the measurements at the two wavelengths, respectively. In the latter case, $\tilde{\phi}_{Abbe}=A\phi_1(\lambda_1)+B\phi_2(\lambda_1)$ can be minimized by minimizing the weighting coefficients A, B for given values of $\lambda_1$, $\lambda_2$, T and the angle of tip/tilt of the wafer-stage. In a specific case, $\tilde{\phi}_{Abbe}$ can be effectively nullified with the appropriate choice of the coefficients A, B.

Assessment of the Abbe Error with Embodiments of the Invention.

It will be understood by a skilled artisan that the Abbe error that corresponds to a measurement at wavelength $\lambda_i$, and is caused by a given amount of tilt of the wafer stage, can be generally calculated based on assessment of a phase change $\phi_i(\lambda_i)$ of the spatial distribution of the interference fringes produced in the plane of the optical detector by a combined beam, which is a result of the spatial recombination of a first portion of the measurement beam (that has been diffracted twice by the wafer-stage diffraction grating) and a second portion of such beam (that has been directly relayed to the optical detector). In FIG. 5, such beam interference is schematically shown by the coherent recombination of the beams 538,A and 540,A with the use of simple beamsplitters into the combined beam 550,A, which is further relayed to the optical detector (not shown). A similarly structured optical train can be employed for the beam 538,B. Interferometer-based measurements of the Abbe errors employ a single-element, high-speed detector capable of measuring the heterodyne signal relative to a reference heterodyne signal (also not shown) and electronic circuitry (including a computer processor) to accurately determine the phase offset between the reference and measurement beams interfered at the detector. The details of the interferometric measurement of Abbe errors are not discussed herein in any further detail as they would be understood by a person of ordinary skill in the art. It can be shown that the wavelength-dependent value of the Abbe error $\phi_i(\lambda_i)$, corresponding to a fixed amount of tip/tilt $\theta$ of the wafer stage about an axial point that is displaced by a distance z along a normal to the surface of the grating 234 with respect to the diffractive surface of the grating 234, is proportional to z. Specifically, $$\phi_1(\lambda_1)=M_1z+b_1 \text{ and} \tag{1a}$$

$$\phi_2(\lambda_2)=M_2z+b_2, \tag{1b}$$

where $M_i$ (defined as an angular value of error per unit of linear distance of change in z, for example, radians per mm) is independent from wavelength, and angle of incidence of light onto the grating. $M_i$ depends only on values of T and and is, therefore, the same and constant for the measurements performed at different wavelengths. Also, $b_i$ is a coordinate of a corresponding intersection between the straight line (1a) or (1b) with the z-axis, which, in this case, is the amount of phase error present when the CoR is a z=0 position (or simply put, when the CoR is in the same plane as the 2D diffraction grating). The values of $b_i$ depend on the transverse separation between the measurement points and the axis. The magnitudes of the slopes of the straight lines expressed by Eqs. (1a), (1b) can be shown to not depend on the wavelength, but be sensitive to only the angle of the tip/tilt of the wafer-stage (and/or wafer-stage grating) and the grating pitch.

Figure 15:
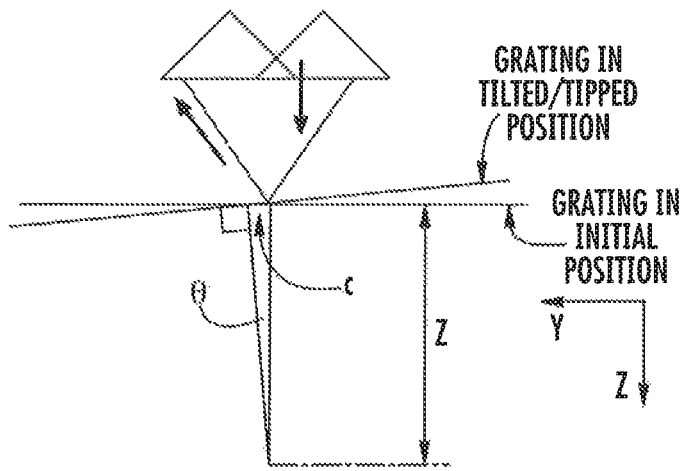
FIG. 15 is a schematic diagram illustrating a determination of substantial linearity of the phase error of the measurement with axial separation between the effective measurement point and a center of tilt of the wafer.

Indeed, and in reference to FIG. 15: Each pass of a diffracted beam off the grating has 1× sensitivity to the x- or y-shift or displacement of the grating (as shown by c). Since each diffracted beam is diffracted by the gratings twice (forming +1 beam, [+1,+1] beam, −1 beam, and [−1,−1] beam) there is a 2× sensitivity to either x- or y-displacement.

By combining the sensitivity factors for various diffractive orders, the total sensitivity of the system to the transverse displacement of the wafer-stage is increased to 4×. In order to convert the value of c (given in mm) to phase and to find the sensitivity as a function of z in mm, the following is obtained for z=1 mm:

$$\varphi_i(\lambda) = 4c \cdot \frac{2\pi}{T} = 8\pi \cdot \sin\theta / T$$

In a non-limiting example, when the grating pitch T=1 um and θ=0.01, $M_1$ can be assessed as about 4.386 rad error per 1 mm of distance z. It can be seen, therefore, that $M_i$ is wavelength-independent.

Figure 9:
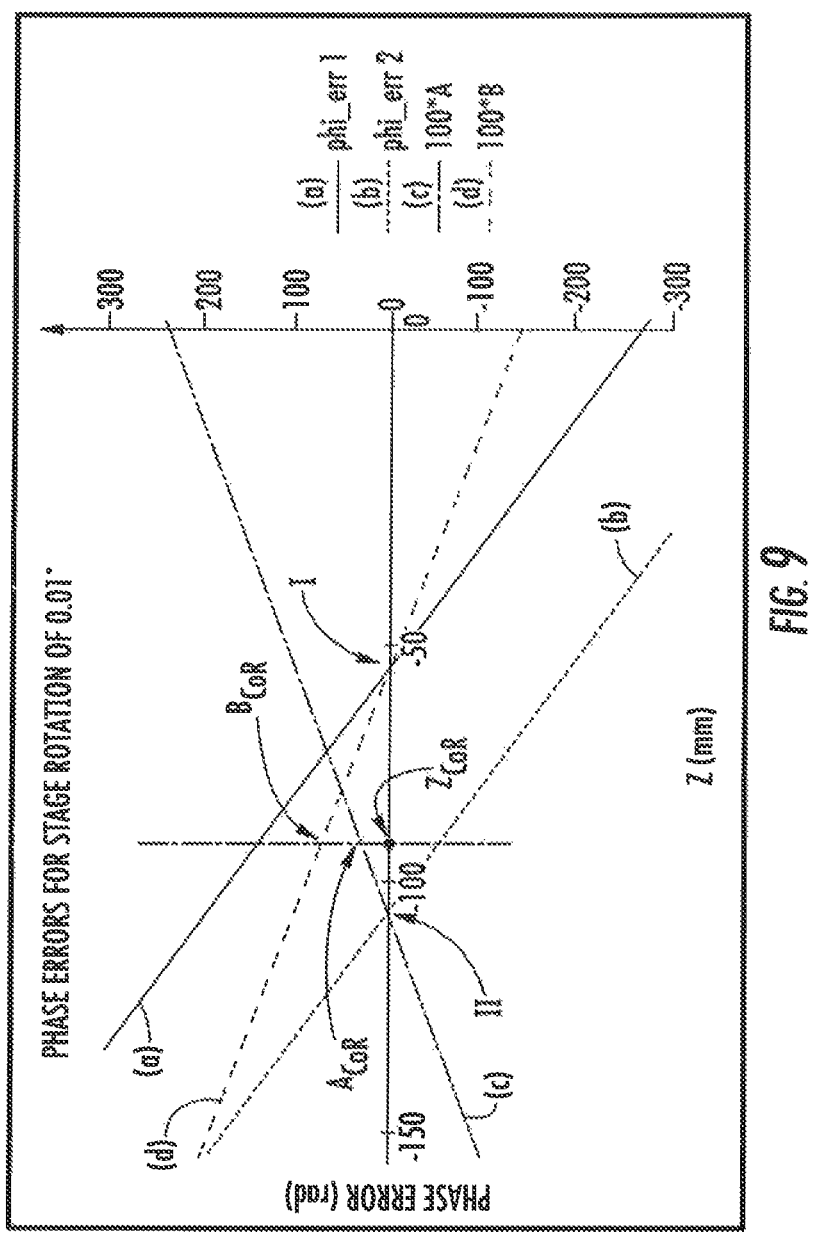
FIG. 9 is a plot illustrating errors corresponding to measurement of a wafer position with the system of FIG. 8 and assessment of measurement conditions resulting in a zero Abbe-error based on weighting sum of individual phase errors associated with different portions of measurement beams.

FIG. 9 is a plot showing the variation of the phase-errors $\phi_1(\lambda_1)$, $\phi_2(\lambda_2)$ derived from the measurement carried out with the use of a schematic arrangement of FIG. 5 for D/2=22 mm, the value of tilt $\theta_Y$=0.01 degree, and $\lambda_1$=632.8 nm, $\lambda_2$=420 nm. FIG. 9 also shows the variation of coefficients A and B (each multiplied by a factor of 100, for better visibility on the plot; in other words the values along the y-axis represent the percentage of the two signals to be used, A and B expressed as percentages) that satisfy the following equation of zero Abbe error:

$$\tilde{\phi}_{Abbe\text{-}free} = A\phi_1(\lambda_1) + B\phi_2(\lambda_1) = 0 \quad (2)$$

During practical measurement, the angle of tip/tilt of the wafer-stage with respect to the ideal, reference position is measured by performing two measurements of the z-position at points spatially separated along the grating. From the values of the measured angle and grating pitch, the parameters $M_1$, $M_2$, $b_1$, $b_2$ are determined as discussed above, and then the weighting coefficients A, B can be determined from Eq. (2) for the zero Abbe error as functions of the z-coordinate. In a specific case, the sum of A and B is set to be one.

In further reference to FIG. 9, for example, at z=−106 mm (as shown) A=0 because no contribution from the measurement at $\lambda_1$ is required to carry out the measurement of the wafer-stage position with a zero Abbe error, and B=1, which means that a measurement free of Abbe error is obtained using only the measurement signal at $\lambda_2$ (see curve (b) of FIG. 9). Graphically, point I in FIG. 9 indicates the value of Z at which the measurement carried out at the wavelength $\lambda_1$ has zero Abbe error; or, put differently, the Z-coordinate of the point I defines the Z-coordinate of $O_{M,1}$. Point II on the graph indicates the value of Z at which the measurement carried out at the wavelength $\lambda_2$ has zero Abbe error; or, put differently, the z-coordinate of the point I defined the z-coordinate of $O_{M,2}$. The phase-error coordinate of the points of the intersections of the lines (a) and (b) with the plot's vertical axis (at z=0) correspond, respectively, to the values of $b_1$ and $b_2$. Based on the plots of FIG. 9, the weighting coefficients $A_{CoR}$ and $B_{CoR}$ that would ensure that the measurement (with D/2=22 mm, $\lambda_1$=632.8 nm, $\lambda_2$=420 nm) is carried with zero Abbe error for the chosen z=$Z_{CoR}$ can be found by determining the values of A and B (from lines (c) and (d), respectively) that correspond to z=$Z_{CoR}$.

It is shown, therefore, that, in practice, the results of any two measurements (at different wavelengths) that define the z-coordinates with zero Abbe errors can be weighted, with the appropriately defined weighting coefficients, to obtain an effective, aggregate measurement that is free of Abbe errors. (Errors due to noise and systematic errors notwithstanding).

In practice, however, there will be measurement noise present and some systematic errors. Accordingly, the assessment of validity of the proposed methodology of minimization of the Abbe error in the presence of noise has to be carried out. As will be seen from the following examples, if the actual z-coordinate of the center of rotation of the wafer-stage is between points I and II, then the weights for both measurement signals will be between 0 and 1, and the amount of noise added to the measurement due to the random noise (that is inherent to both phase-measurement signals) is not excessive.

Each of the measurements, $\phi_1$, $\phi_2$ has some random, independent noise error present. In the case of signal averaging (A=B=0.5), the independent random noise error is: $\sqrt{A^2+B^2}$=0.707. Such random error of the measurement is smaller than any of random errors of 1.0 associated, respectively, with either of single measurements $\phi_1$ or $\phi_2$. In other words, for measurement at any point between the points I and II the relative error is less than 1.0. When A=1 and B=0, the relative error is 1.0. When A=2 and B=−1 (which corresponds to a point outside of the region between the points I and II), the measurement error is even higher (in this specific case, reaching 2.23).

Figure 8:
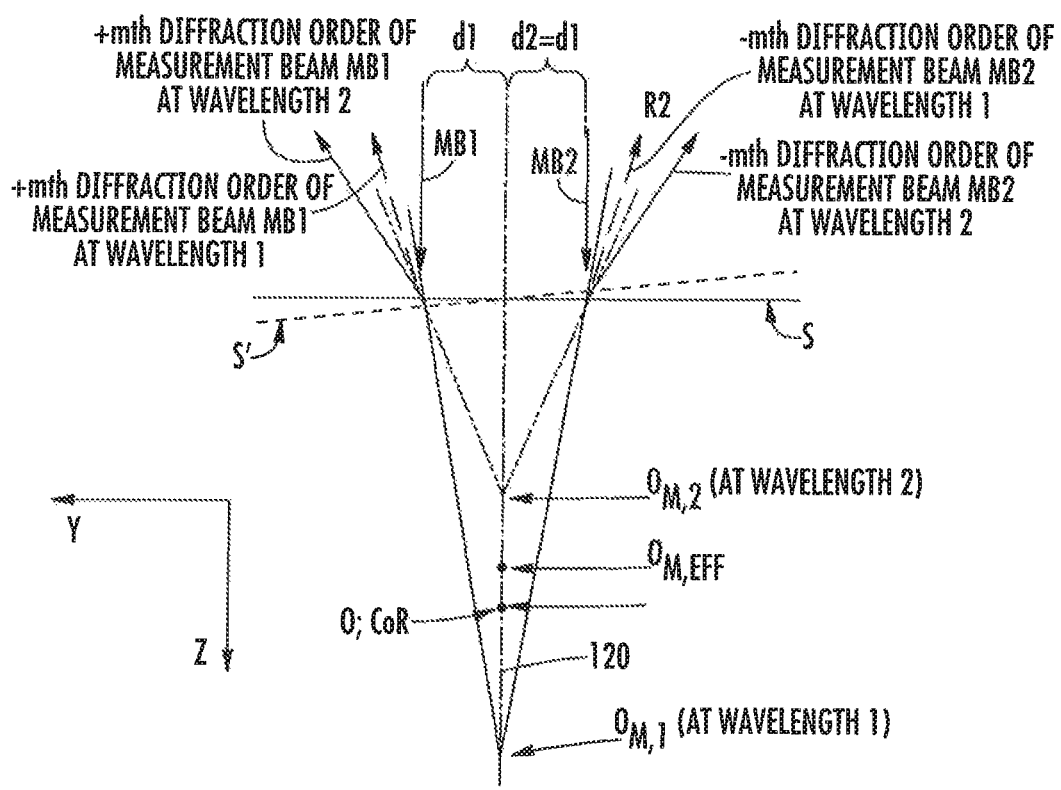
FIG. 8 is a schematic diagram illustrating assessment of an effective point of measurement based on portions of measurement beams employed in a system of FIG. 5.
Figure 10:
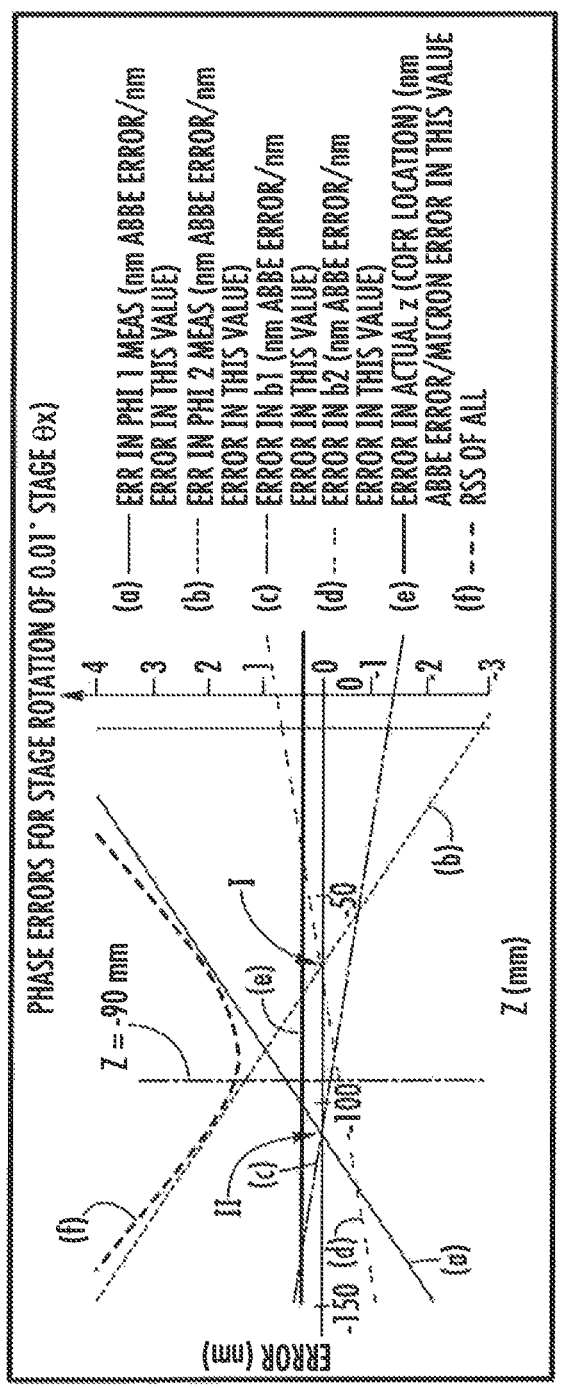
FIG. 10 shows the plots illustrating a determination of measurement noise caused by errors in determining the wafer-stage position with the use of an embodiment of FIG. 8.

To this end, FIG. 10 shows the plots illustrating a determination of "measurement noise" caused by errors in determining the wafer-stage position with the use of an embodiment of FIGS. 5, 8 (and for D/2=22 mm, $\theta_Y$=0.01 degree, a z-coordinate of −62 mm for $\phi_1(\lambda_1)$=0, and a z-coordinate of −106 mm for $\phi_1(\lambda_1)$=0, as discussed in reference to FIG. 9). In particular, FIG. 10 illustrates the minimization of the root-sum-squared (RSS) of errors of the measurement including (i) curves (a) and (b), representing errors of the determination of the wafer-stage position resulting from the errors in the phase measurements $\phi_1(\lambda_1)$, $\phi_2(\lambda_2)$ (and dimensioned as nanometers of Abbe error induced per nanometer in error of the stated measurement value); (ii) curves (c) and (d), representing errors in a-priori knowledge or determination of the coefficients $b_1$ and $b_2$ (dimensioned as nanometers of Abbe error induced per nanometer in error of the stated input value); and (iii) curve (e) representing an error in determining the effective $Z_{CoR}$ as discussed in reference to FIG. 9 (and dimensioned as nanometers of Abbe error induced per micron in error of the stated input value). An extremum of curve (f) representing the RSS, of all these errors, with respect to z is located at z=−87 mm, at a point between the two zero-Abbe-error points I and II. Accordingly, it will be understood by a person of ordinary skill in the art that the proposed methodology of reducing (or eliminating) the Abbe-error works best if the actual CoR is located between the points I and II.

It can be seen that, with the input conditions as defined above, at z=−90 mm (which corresponds to the typical thickness of 90 mm of the currently used wafer-stage), the noise factor is about 1.51 nm, which is only about 1.03 times larger than the minimum value of the noise at the minimum of curve (f) (z=−84 mm) Overall, while the embodiment of FIG. 9 provides a very robust solution even in the presence of measurement noise, it accommodates only one measurement per back-side encoder, and is possibly susceptible to the grating being not flat.

Correction for Non-Flatness of Wafer-Stage Grating.

Related embodiments of the invention may be structured to carry out measurements with reduced sensitivity to the non-flatness of the 2D diffraction wafer-stage grating. As schematically illustrated in FIG. 11, one such measurement scheme includes, for example:

(i) an "Abbe-error correcting" measurement at the second, shorter wavelength $\lambda_2$ (for example, $\lambda_2$=420 nm) at the points K1, K2 of the wafer grating that are far-removed from its center (for example, at +1 and −1 orders of diffraction corresponding to the two outmost, peripheral points K of the grating that are disposed symmetrically with respect to its center at $D_{max}/2$), and (ii) several measurements at the first, longer wavelength $\lambda_1$ (for example, $\lambda_1$=632.8 nm) at the points corresponding, for example, to (ii-a; ii-b) multiple points disposed on the opposite side with respect to the center of the grating (for example, as shown, at two points L2 and L3, separated by a distance d=d1+d2; in a specific case d1 may be equal to d2) and, optionally, (ii-c) the center of the grating (the axial point, L1). Each of the measurements carried out at the longer wavelength is structured such that the separation between the +1 and −1 orders of diffraction is substantially zero, i.e. the four measurement beams at $\lambda_1$ are incident onto the grating at the same point (the +1 beam, the −1 beam, the [+1,+1] and the [−1,−1] beams).

To determine the position of the effective CoR corresponding to the zero Abbe error, according to the method discussed above, the measurements (i) and (ii) are followed by weighing each of the results of the measurement (ii) with the result of the Abbe-error correcting results of the measurement (i). The measurements (ii), performed at multiple points across the grating and combined with the proper choice of the A and B weighting coefficients, facilitate a correction of the results for a degree of non-flatness that may be present in the grating.

Figure 11:
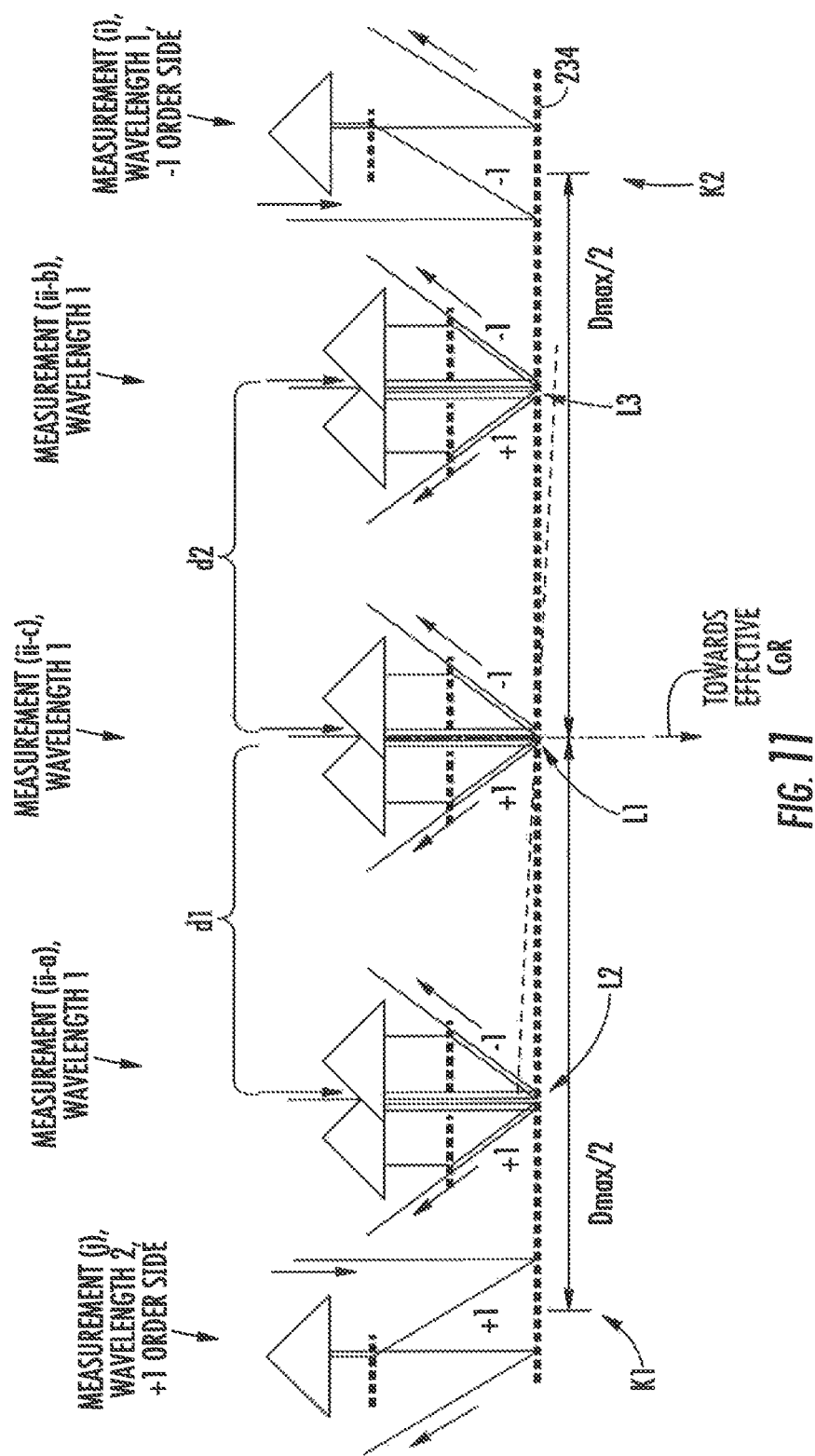
FIG. 11 is a simplified schematic diagram illustrating a related embodiment of a measurement system.
Figure 12:
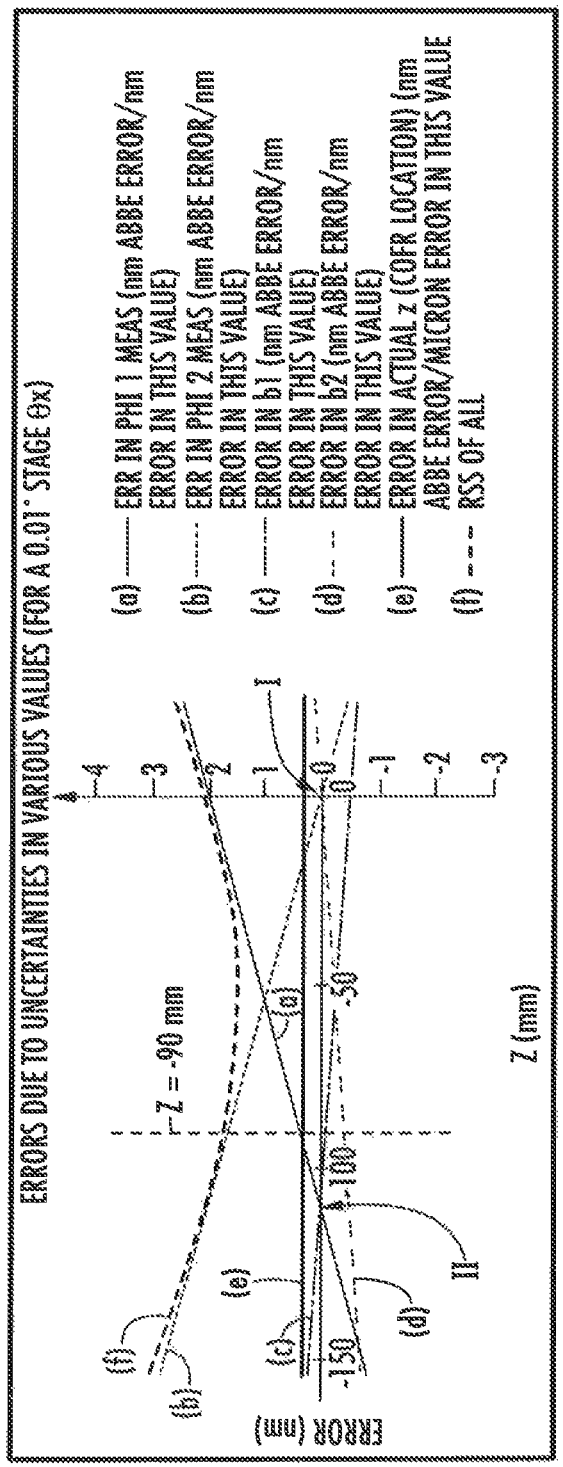
FIG. 12 shows the plots illustrating a determination of measurement noise caused by errors in determining the wafer-stage position with the use of an embodiment of FIG. 11.

FIG. 12 showing the plots illustrating a determination of "measurement noise" caused by errors in determining the wafer-stage position with the use of the specific version of the embodiment of FIG. 11, in which the optional measurement (ii-c) is not performed. Here, D/2=22 mm, $\theta_Y$=0.01 degree. In particular, and by analogy with FIG. 10, FIG. 12 illustrates the minimization of the root-sum-squared (RSS) of errors of the measurement including (i) curves (a) and (b), representing errors of the determination of the wafer-stage position resulting from the errors in the phase measurements $\phi_1(\lambda_1)$, $\phi_2(\lambda_2)$ (and dimensioned as nanometers of Abbe error induced per nanometer in error of the stated input value); (ii) curves (c) and (d), representing errors in a-priori knowledge or determination of the coefficients $b_1$ and $b_2$ (dimensioned as nanometers of Abbe error induced per nanometer in error of the stated input value); and (iii) curve (e) representing an error in determining the effective $Z_{CoR}$ as discussed in reference to FIG. 9 (and dimensioned as nanometers of Abbe error induced per micron in error of the stated input value). An extremum of curve (f) representing the RSS of all these errors, shows the "noise" value that is larger than that of FIG. 10 but, at the same time, the slope of the curve (f) is smaller than that of FIG. 10. Notably, this indicates that the contribution of errors to the measurement does not increase quickly with the change of location of the CoR relative to the best point (halfway between points I and II). At z=−90 mm (which corresponds to the typical thickness of 90 mm of the currently used wafer-stage), the noise factor is about 1.76 nm, which is about 1.22 times larger than the minimum value of the noise at the minimum of curve (f) (z=−53 mm) The amount of noise increases more quickly, at a point of measurement outside of the range between points I and II, if points I and II are closer together. Physically, it can be viewed as a tradeoff between the smallest minimum error (when points I and II close together) and a broad spatial region (points I and II are far apart) within which the measurement can be performed with a relatively small error.

Figure 13:
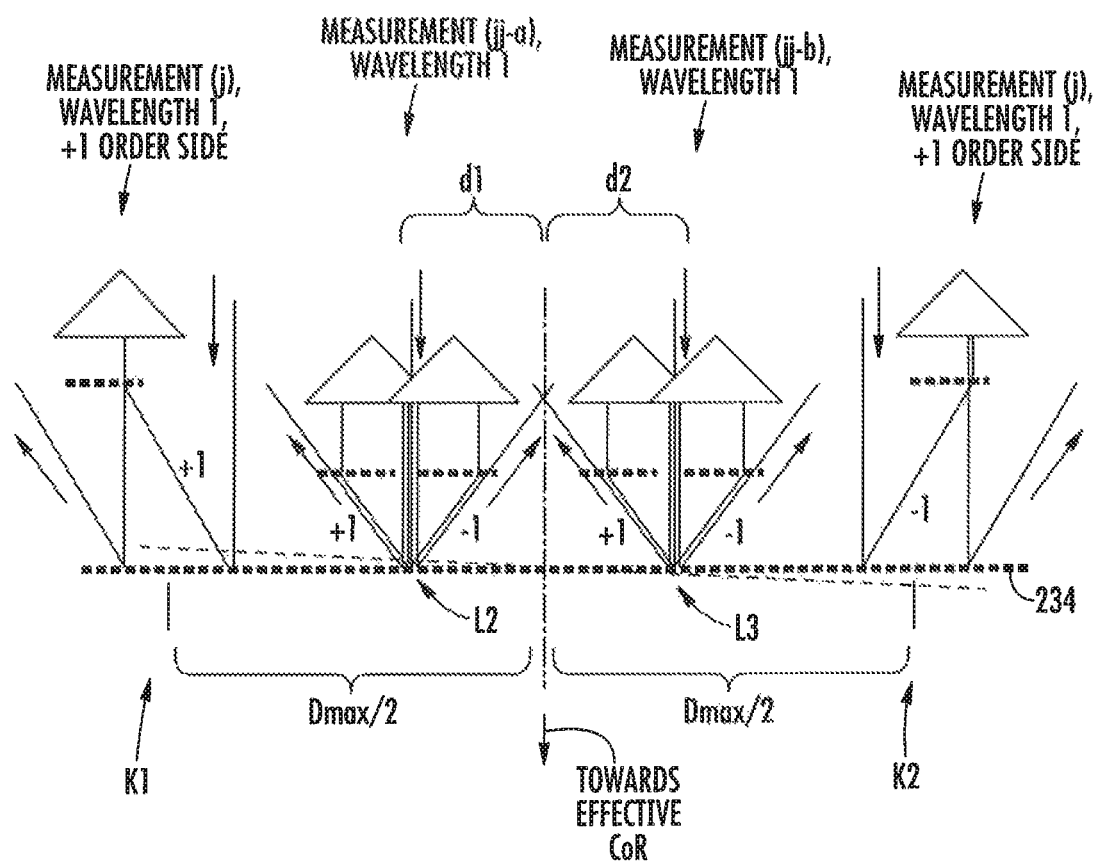
FIG. 13 is a simplified schematic diagram illustrating a related embodiment of a measurement system.

As shown in FIG. 13, an alternative scheme with reduced sensitivity to the non-flatness of the wafer-stage grating may employ the measurements carried out only at a single wavelength (for example, at wavelength $\lambda_1$) in a set-up similar to that of FIG. 11 but without the measurement at an axial point L1. Here, the following measurements are taken:

(j) an "Abbe-error correcting" measurement at wavelength $\lambda_1$ at the points K1, K2 of the wafer grating that are far-removed from its center (for example, at +1 and −1 orders of diffraction corresponding to the two outmost, peripheral points of the grating that are disposed symmetrically with respect to its center at $D_{max}/2$), and (jj) several measurements at wavelength $\lambda_1$ at the points corresponding, for example, to (ii-a; ii-b) multiple points disposed on the opposite side with respect to the center of the grating (for example, as shown, at two points L2 and L3, separated by a distance d=d1+d2; in a specific case d1 may be equal to d2). Each of the (jj) measurements is structured such that the separation between the +1 and −1 orders of diffraction is substantially zero, i.e. the four beams at $\lambda_1$, employed during the measurement (+1, −1, [+1,+1] and [−1,−1] diffracted beams) are incident onto the grating at the same point.

Figure 14:
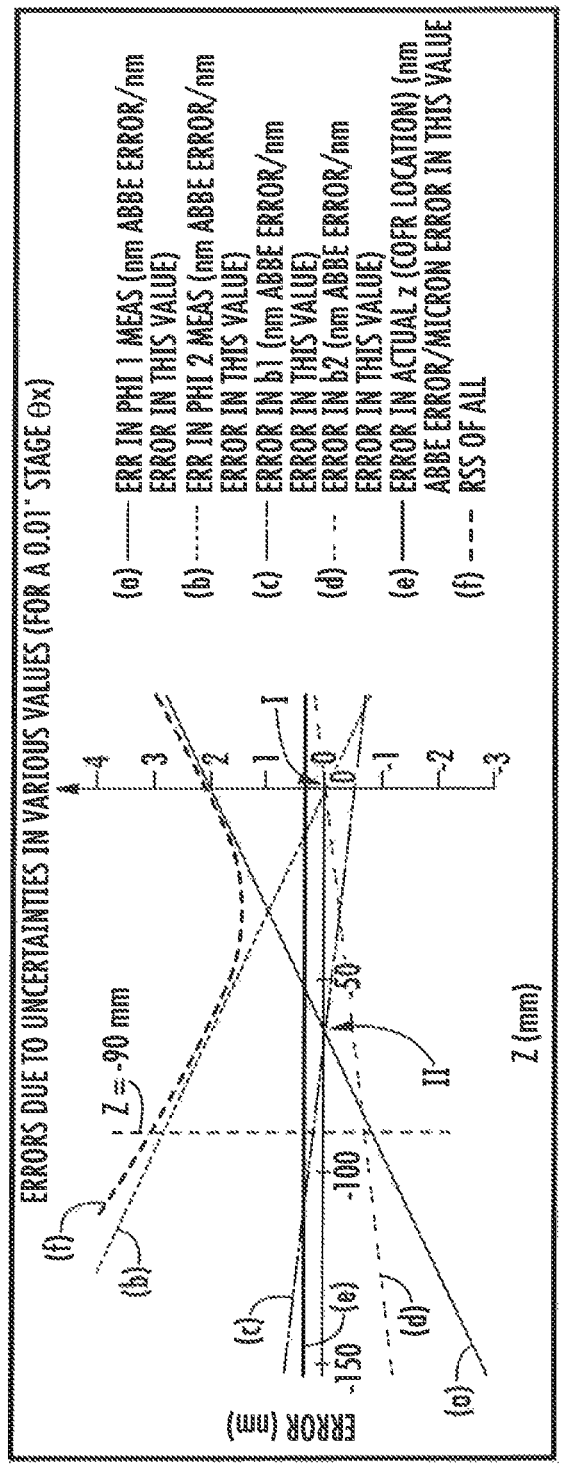
FIG. 14 shows the plots illustrating a determination of measurement noise caused by errors in determining the wafer-stage position with the use of an embodiment of FIG. 13.

It is appreciated that, in comparison with "measurement noise" of the embodiments discussed in reference to FIG. 10 and FIG. 12, the noise factor associated the measurement carried out with the embodiment of FIG. 13 would be the highest (for the same chosen z value). This is shown in FIG. 14: At z=−90 mm (which corresponds to the typical thickness of 90 mm of the currently used wafer-stage), the noise factor is about 3.08 nm, which is about 2.12 times larger than the minimum value of the noise at the minimum of curve (f) (z=−31 mm).

A skilled artisan will appreciate, therefore, that methodology of reducing (or, in a specific case, eliminating) the Abbe error during the metrology of the wafer with the use of a heterodyne system of the invention includes, generally, adding a complementary, Abbe-error-correcting measurement signal for which the induced Abbe error is either opposite in sign to or at least different from the Abbe error corresponding to the main measurement signal. The embodiment is structured such that, as a result of such addition, the overall Abbe error is negated and/or removed by combining the main and complementary signals either via averaging of the individual Abbe errors corresponding to the individual measurements performed with the main and complementary signals, or via the appropriately defining a weighted sum of such individual measurements. The corresponding metrological measurements are preferably conducted substantially contemporaneously with the process of wafer exposure with the pattern-forming light from the projection system in the area of the wafer in which the footprint of the exposure beam and the footprint of the measurement beam(s) overlap.

Figure 16:
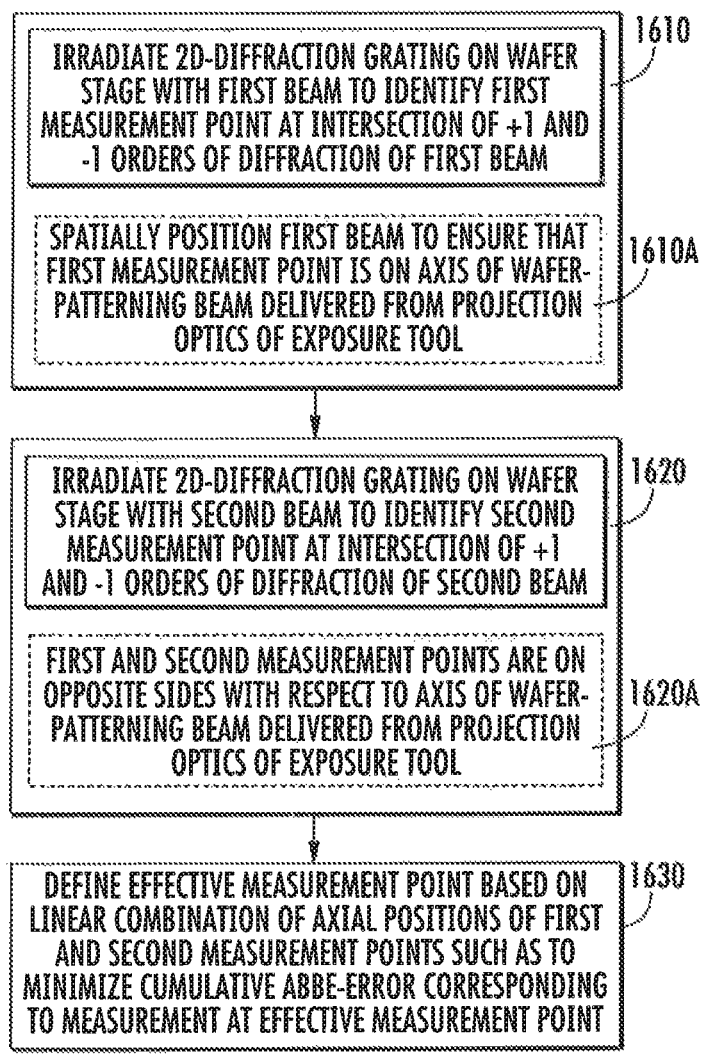
FIG. 16 is a flow-chart illustrating schematically an embodiment of the method of the present invention.

According to major steps of one implementation of the method of the invention, schematically illustrated in FIG. 16, a first measurement is performed at step 1610 by delivering a first measurement beam from the back-side encoder head onto the wafer-stage 2D grating of the heterodyne measurement interferometric system of the invention such as to define a first measurement point substantially coinciding with a point defined by the intersection of the +1 and −1 orders of diffraction of the first measurement beam in a given diffraction plane defined by the grating. In a specific case, 1610A, such first measurement point lies on the axis of the pattern-defining beam delivered from the projection optics to the wafer.

At step 1620, contemporaneously with the step 1610, a second measurement is performed by delivering a second measurement beam from the back-side encoder head onto the wafer-stage 2D grating of the heterodyne interferometric system of the invention such as to define a second measurement point that, on one hand, is defined by the intersection of the +1 and −1 orders of diffraction of the second measurement beam in the same given diffraction plane of the grating and, on the other hand, is axially separated from the first measurement point. The first measurement point is associated with a zero Abbe error of the first measurement, while the second measurement point is associated with the zero Abbe error of the second measurement.

It is appreciated that the described methodology is fully enabled when the stage grating is a 1D diffraction grating (for example, in a situation where the wafer stage is tipping or tilting about a single axis, with respect to the encoder head).

In one specific implementation, 1620A, at least one of the first and second measurements is structured such that the corresponding +1 and −1 diffractive orders are formed at two spatially separated points of the wafer-stage 2D grating located on the opposite sides with respect to the axis of the pattern-defining beam incident onto the wafer from the projection optics. Alternatively or in addition, at least one of the first and second measurements is performed at multiple locations across the wafer-stage gratings such that, in each of these multiple locations, both the +1 and −1 corresponding diffractive orders of the measurement beam are formed at the same point of the wafer-stage grating. Alternatively or in addition, the first and second measurements are performed at different wavelengths.

At step 1630, the effective axial measurement point is defined based at least on linear dependencies on the axial coordinates of the Abbe error functions, that are associated with the first and second measurements, by minimizing the sum of these (appropriately weighted) Abbe error functions. In one specific case, the effective axial measurement point is defined by determining a geometric average of the axial positions of the first and second measurement points. In another related case, the weighting coefficients are chosen such as to define the axial position of the effective measurement point at the location corresponding to the physical center of rotation of the wafer-stage (with the wafer and the wafer-stage grating on it).

An embodiment of the system of the invention include electronic circuitry (for example, a computer processor) controlled by instructions stored in a memory, to perform specific data collection/processing and calculation steps as disclosed above. The memory may be random access memory (RAM), read-only memory (ROM), flash memory or any other memory, or combination thereof, suitable for storing control software or other instructions and data. Those skilled in the art should would readily appreciate that instructions or programs defining the operation of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

The use of the term "substantially" as applied to a specified characteristic or quality descriptor means "mostly", "mainly", "largely but not necessarily wholly the same" such as to reasonably denote language of approximation and describe the specified characteristic or descriptor so that its scope would be understood by a person of ordinary skill in the art. The use of this term both in the present disclosure and the appended claims neither implies nor provides any basis for indefiniteness and for adding a numerical limitation to the specified characteristic or descriptor. For example, a reference to a vector or line being substantially parallel to a reference line or plane is to be construed as such vector or line extending along a direction that is the same as or very close to that of the reference line or plane (for example, with angular deviations from the reference direction that are considered to be practically typical in the art). As another example, the use of the term "substantially flat" in reference to the specified surface implies that such surface may possess a degree of non-flatness and/or roughness that is sized and expressed as commonly understood in the art in the specific situation at hand. As yet another example, the first and second directions being substantially opposite to one another refers to the situation when an angle between the vectors representing such directions is close to 180 degrees and may deviate from 180 degrees either by a typical error made during the corresponding measurement by a skilled artisan or within +/−10 degrees, whichever is larger.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, when the present disclosure describes features of the invention with reference to corresponding drawings (in which like numbers represent the same or similar elements, wherever possible), the depicted structural elements are generally not to scale, and certain components may be enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, at least for purposes of simplifying the given drawing and discussion, and directing the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this particular detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

Moreover, if the schematic flow chart diagram is included, it is generally set forth as a logical flow-chart diagram. As such, the depicted order and labeled steps of the logical flow are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Without loss of generality, the order in which processing steps or particular methods occur may or may not strictly adhere to the order of the corresponding steps shown.

The invention as recited in claims appended to this disclosure is intended to be assessed in light of the disclosure as a whole, including features disclosed in prior art to which reference is made.

Disclosed aspects, or portions of these aspects, may be combined in ways not listed above. Accordingly, the invention should not be viewed as being limited to the disclosed embodiment(s).

The invention claimed is:

1. A measurement system for measuring a position of a workpiece, the system comprising:
a diffraction grating mechanically coupled to the workpiece;
an encoder unit facing said diffraction grating, the encoder unit having first and second encoder heads, said heads configured to produce respectively-corresponding first and second measurement beams incident onto a grating at a respectively corresponding first and second points of incidence and to form first and second first.-order diffraction beams at said first and second points of incidence,
said encoder unit positioned
to reduce first and second separations to a point when an overall Abbe error, calculated based on first and second Abbe errors, is smaller than a first Abbe error and a second Abbe error, wherein
the first separation defined between i) a first point of intersection of a first vector, bisecting an angle formed by the first measurement beam and the corresponding first first-order diffraction beam and ii) a center-of rotation of the workpiece;
the second separation defined between second point of intersection of a second vector, bisecting an angle formed by the second measurement beam and the corresponding second first-order diffraction beam and iv) the center-of rotation; and
the first Abbe error corresponds to measurement data acquired based on a first measurement associated, with the first separation,
the second Abbe error corresponds to measurement data acquired based on a second measurement associated with the first separation.

2. A system according to claim 1,
wherein each of the first and second first-order diffraction beams includes first and second wavelengths to define first and second points of intersection of said first and second first-order diffraction beams formed with light at said first and second wavelengths, and
wherein the first and second points of intersection and the center-of-rotation are different points.

3. A system according to claim 2, wherein the first and second points of intersection are located on the opposite sides of the center-of-rotation.

4. A system according to claim 1, further comprising
an optical detector, and
programmable processor in operable cooperation with tangible non-transitory storage medium and said encoder unit, said processor programmed to acquire optical data, representing interference of light from the first and second measurement beams after said beams have diffracted twice at the diffraction grating, and to reposition at least one of the first and second encoder heads with respect to the diffraction grating such as to minimize a linear combination of first and second Abbe-errors,
wherein the first Abbe-error is defined by a measurement of the e position with the first measurement beam, and the second Abbe-error is defined by a measurement of the position with the second measurement beam.

5. A system according to claim 1, wherein said diffraction grating is disposed in a plane located between the workpiece and the encoder unit.

6. A system according to claim 1, wherein said diffraction grating is a two-dimensional (2D) diffraction grating.

7. An exposure apparatus comprising a system according to claim 6, said exposure apparatus containing an optical system separated from the encoder unit by the workpiece.

8. An exposure apparatus according to claim 6, wherein the first and second points of intersection and the center-of-rotation are positioned on an optical axis of said optical system.

9. An exposure system according to claim 7, wherein the workpiece carrying the diffraction grating on a first side thereof has a wafer on a second side thereof, the first and second sides being opposite to one another.

10. A measurement system for measuring a position of a workpiece, the system comprising:
a stage including a holding surface in contact with the workpiece;
a diffraction grating positioned on an opposite side of the stage with respect to the workpiece; and
an encoder unit facing the diffraction grating, the encoder unit including:
a first encoder head, configured to produce and direct a first measurement beam of light towards a first point on the diffraction grating to form a first diffracted beam of light at said first point,
wherein a first angle, formed by said first measurement beam of light and said first diffracted beam of light at said first point, has a first bisector;
a second encoder head, configured to produce and direct a second measurement beam of light towards a second point on the diffraction grating to form a second diffracted beam of light at said second point, wherein a second angle, formed by said first measurement beam of light and said second diffracted beam of light at said second point, has a second bisector, wherein the first and second bisectors cross each other at an intersection point, and wherein a first separation between the diffraction grating and the intersection point along a direction perpendicular to the diffraction grating is larger than a second separation between the intersection point and the holding surface along said direction.

* * * * *